(12) United States Patent
Nakamura et al.

(10) Patent No.: US 7,919,411 B2
(45) Date of Patent: Apr. 5, 2011

(54) METHOD FOR MANUFACTURING WIRING, THIN FILM TRANSISTOR, LIGHT EMITTING DEVICE AND LIQUID CRYSTAL DISPLAY DEVICE, AND DROPLET DISCHARGE APPARATUS FOR FORMING THE SAME

(75) Inventors: Osamu Nakamura, Kanagawa (JP); Kiyofumi Ogino, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 32 days.

(21) Appl. No.: 12/432,503

(22) Filed: Apr. 29, 2009

(65) Prior Publication Data

US 2009/0258450 A1    Oct. 15, 2009

Related U.S. Application Data

(62) Division of application No. 11/970,318, filed on Jan. 7, 2008, now Pat. No. 7,534,724, and a division of application No. 10/946,649, filed on Sep. 22, 2004, now Pat. No. 7,332,432.

(30) Foreign Application Priority Data

Oct. 2, 2003 (JP) ................................. 2003-344202

(51) Int. Cl.
*H01L 21/44* (2006.01)
(52) U.S. Cl. . 438/677; 438/149; 438/674; 257/E21.174; 257/E21.295; 257/E21.479
(58) Field of Classification Search ............ 438/677, 438/149, 674; 257/E21.174, E21.295, E21.479
See application file for complete search history.

(56) References Cited

U.S. PATENT DOCUMENTS

| | | | |
|---|---|---|---|
| 5,598,285 | A | 1/1997 | Kondo et al. |
| 5,737,051 | A | 4/1998 | Kondo et al. |
| 6,090,489 | A | 7/2000 | Hayakawa et al. |
| 6,124,915 | A | 9/2000 | Kondo et al. |
| 6,341,004 | B1 | 1/2002 | Kondo et al. |
| 6,369,410 | B1 | 4/2002 | Yamazaki et al. |
| 6,514,801 | B1 | 2/2003 | Yudasaka et al. |
| 6,613,614 | B2 | 9/2003 | Yamazaki et al. |

(Continued)

FOREIGN PATENT DOCUMENTS

EP    0588568 A2    3/1994

(Continued)

OTHER PUBLICATIONS

Japan Search Report, Application No. 2003-344202 mailed Jul. 26, 2005.

*Primary Examiner* — David A Zarneke
(74) *Attorney, Agent, or Firm* — Nixon Peabody LLP; Jeffrey L. Costellia

(57) ABSTRACT

As a semiconductor device, specifically, a pixel portion included in a semiconductor device is made to have higher precision and higher aperture ratio, it is required to form a smaller wiring in width. In the case of forming a wiring by using an ink-jet method, a dot spreads on a wiring formation surface, and it is difficult to narrow width of a wiring. In the present invention, a photocatalytic substance typified by $TiO_2$ is formed on a wiring formation surface, and a wiring is formed by utilizing photocatalytic activity of the photocatalytic substance. According to the present invention, a narrower wiring, that is, a smaller wiring in width than a diameter of a dot formed by an ink-jet method can be formed.

5 Claims, 20 Drawing Sheets

U.S. PATENT DOCUMENTS

| | | |
|---|---|---|
| 6,724,455 B2 | 4/2004 | Kondo et al. |
| 6,734,029 B2 | 5/2004 | Furusawa |
| 6,833,225 B2 | 12/2004 | Ooishi |
| 6,846,616 B2 | 1/2005 | Kobayashi et al. |
| 7,119,026 B2 | 10/2006 | Honda et al. |
| 7,205,096 B2 | 4/2007 | Park et al. |
| 2002/0063822 A1 | 5/2002 | Kondo et al. |
| 2002/0096681 A1 | 7/2002 | Yamazaki et al. |
| 2003/0129321 A1 | 7/2003 | Aoki |
| 2004/0189923 A1 | 9/2004 | Kondo et al. |
| 2005/0163938 A1 | 7/2005 | Yamazaki et al. |

FOREIGN PATENT DOCUMENTS

| | | |
|---|---|---|
| EP | 0916992 A2 | 5/1999 |
| EP | 1061404 A1 | 12/2000 |
| EP | 1113502 A1 | 7/2001 |
| JP | 06-273803 | 9/1994 |
| JP | 09-179142 | 7/1997 |
| JP | 09-260808 | 10/1997 |
| JP | 11-261076 | 9/1999 |
| JP | 11-340129 | 12/1999 |
| JP | 2001-179167 | 7/2001 |
| JP | 2002-190598 | 7/2002 |
| JP | 2003-058077 | 2/2003 |
| JP | 2003-178872 | 6/2003 |
| JP | 2003-197612 | 7/2003 |
| JP | 2003-209339 | 7/2003 |
| JP | 2003-209340 | 7/2003 |
| JP | 2003-229579 | 8/2003 |
| WO | WO 00/59040 | 10/2000 |

METHOD FOR MANUFACTURING WIRING, THIN FILM TRANSISTOR, LIGHT EMITTING DEVICE AND LIQUID CRYSTAL DISPLAY DEVICE, AND DROPLET DISCHARGE APPARATUS FOR FORMING THE SAME

BACKGROUND OF THE INVENTION

1. Field of the Invention

The present invention relates to a method for manufacturing a wiring and a method for manufacturing a semiconductor device such as a light emitting device or a liquid crystal display device by a droplet discharge (ink-jet) method utilizing a photocatalytic reaction. In addition, the invention relates to a droplet discharge apparatus for forming them.

2. Related Art

A droplet discharge technique typified by a piezo method or a thermal jet method, or a continuous droplet discharge technique has attracted attention. This droplet discharge technique has been used in printing a type and drawing an image. However, an attempt to apply it to a semiconductor field, for example, micropattern formation or the like has begun in recent years.

On the other hand, there is a method for forming a patterned metal film made of only an absorption metal atom by soaking a base material provided with a substance having a photocatalytic function over its surface in a metal-ion-containing aqueous solution including alcohol, by drawing on the base material with a predetermined pattern by laser light, and by soaking the base material in an aqueous solution capable of forming a complex to remove the absorption metal ion, as a conventional method for forming a metal wiring by a photocatalytic reaction (for example, Reference 1: Japanese Patent Laid-Open No. 9-260808).

In addition, titanium oxide ($TiO_2$) used as a photocatalytic material is an N-type semiconductor. It is known that a photocatalytic reaction is caused on its surface when the surface is irradiated with light of a wavelength in an ultraviolet region and it has an effect such as deodorization, mildew proofing, antifouling, or antibacterial due to activated species generated on the surface. There are three types of titanium oxide called a rutile type, an anatase type, a brookite type, each of which has a different crystal structure. It is the anatase type that has the highest photocatalytic activity among them.

In the case of forming a wiring by using an ink-jet method as described above, a droplet (a dot) discharged from an ink-jet nozzle spreads on a wiring formation surface, and it is difficult to narrow a line width (simply referred to as a width) of a wiring. On the other hand, as a semiconductor device, specifically, a pixel portion included in a semiconductor device is made to have higher precision and higher aperture ratio, it is required to form a narrower wiring.

Further, in the case where the wiring formation surface is liquid-repellent, a landed dot easily rolls on the surface and coheres. Therefore, it is difficult to draw a continuous line in a desired region.

Thus, it is difficult to form a small wiring in width and to control a position of a wiring to be formed in a designated position by an ink-jet method.

SUMMARY OF THE INVENTION

It is an object of the present invention to provide a method for forming a wiring which is narrower and of which position is easily controlled in forming a wiring by an ink-jet method.

In addition, it is an object to provide a thin film transistor and a semiconductor device having the wiring and a manufacturing method thereof.

In view of the above object, a wiring is formed by utilizing photocatalytic activity of a substance having a photocatalytic function (hereinafter, simply referred to as a photocatalytic substance) according to the present invention. Specifically, a wiring material mixed into a solvent (including a wiring material (conductive material) dissolved or dispersed in a solvent) is formed over the photocatalytic substance or at opposite ends thereof by an application method or the like, thereby forming a wiring. For example, a conductive material mixed into a solvent is discharged onto the photocatalytic substance by an ink-jet method. The conductive material mixed into a solvent may be formed over the photocatalytic substance by a spin coating method, a dipping method, or another application method besides an ink-jet method.

It is preferable to use titanium oxide ($TiO_2$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like as the photocatalytic substance. The photocatalytic substance is irradiated with light of an ultraviolet light region (wavelength: equal to or less than 400 nm, preferably, equal to or less than 380 nm) to be photocatalytically activated. At this time, a width of a light irradiation region can be made narrower than a diameter of a dropped droplet (also referred to as a dot), and minute drawing can be performed.

For example, $TiO_2$ is not hydrophilic but oleophilic, that is, water-repellent before being irradiated with light. Light irradiation causes photocatalytic activity, and $TiO_2$ is converted into hydrophilic and non-oleophilic, that is, oil-repellent. Note that $TiO_2$ can be at once hydrophilic and oleophilic depending on a length of irradiation time.

Note that "hydrophilic" means a state which is easy to be got wet with water and has a contact angle of equal to or less than 30°. Specifically, a state having a contact angle of equal to or less than 5° is referred to as "super-hydrophilic". On the other hand, "water-repellent" means a state which is hard to be got wet with water and has a contact angle of equal to or more than 90°. Similarly, "oleophilic" means a state which is easy to be got wet with oil, and "oil-repellent" means a state which is hard to be got wet with oil. Note that the contact angle means an angle made by a formation face and a tangent to a droplet on the edge of a dropped dot.

Namely, a region irradiated with light (hereinafter, referred to as an irradiation region) becomes hydrophilic or super-hydrophilic (simply collectively referred to as hydrophilic). At this time, light irradiation is performed so that a width of an irradiation region is a desired width of a wiring. Thereafter, a dot including a conductive material mixed into a water-based solvent is discharged from above the irradiation region to the irradiation region by an ink-jet method. Then, a smaller wiring in width, that is, a narrower wiring than a diameter of a dot discharged merely by an ink-jet method can be formed. This is because the irradiation region is formed to have a desired width of a wiring, and then, a discharged dot can be prevented from spreading on a formation surface. Further, a wiring can be formed along the irradiation region even in the case where a dot is discharged out of alignment to some extent. Thus, a position of a wiring to be formed can be controlled with accuracy.

In the case of using a water-based solvent, it is preferable to add a surfactant in order to smoothly discharge a droplet from a nozzle of an ink-jet apparatus.

In the case of discharging a conductive material mixed into an oil (alcohol) based solvent, a wiring can be similarly formed by discharging a conductive material onto a region which is not irradiated with light (hereinafter, referred to as a non-irradiation region) and discharging a dot from above the non-irradiation region to the non-irradiation region. Namely, opposite ends of a region where a wiring is to be formed, that is, the periphery surrounding the region where a wiring is to be formed may be irradiated with light, thereby forming an irradiation region. Since the irradiation region is oil-repellent at this time, a dot including a conductive material mixed into an oil (alcohol) based solvent is selectively formed in the non-irradiation region. Namely, light irradiation is performed so that a width of the non-irradiation region is a desired width of a wiring.

Note that a nonpolar solvent or a low polar solvent can be used as the oil (alcohol) based solvent. For example, terpineol, mineral spirit, xylene, toluene, ethyl benzene, mesitylene, hexane, heptane, octane, decane, dodecane, cyclohexane, or cyclooctane can be used.

Further, photocatalytic activity can be improved by doping a transition metal (such as Pd, Pt, Cr, Ni, V, Mn, Fe, Ce, Mo, or W) into the photocatalytic substance, and photocatalytic activity can be caused by light of a visible light region (wavelength: from 400 nm to 800 nm). This is because the transition metal can form a new level within a forbidden band of an active photocatalyst having a wide band gap and can expand a light absorption range to a visible light region. For example, an acceptor type such as Cr or Ni, a donor type such as V or Mn, an amphoteric type such as Fe, or other types such as Ce, Mo, and W can be doped. A wavelength of light can thus be determined depending on the photocatalytic substance. Therefore, light irradiation means to irradiate with light having such a wavelength that photocatalytically activates the photocatalytic substance.

When the photocatalytic substance is heated and reduced in a vacuum or under reflux of hydrogen, an oxygen defect is generated in crystal. Without doping a transition element, an oxygen defect plays a similar role to an electron donor in this way. Specifically, in the case of forming by a sol-gel method, the photocatalytic substance may not be reduced since an oxygen defect exists from the beginning. In addition, an oxygen defect can be formed by doping a gas of $N_2$ or the like.

Gold, silver, copper, platinum, palladium, tungsten, nickel, tantalum, bismuth, lead, indium, tin, zinc, titanium, aluminum, an alloy thereof, a dispersive nanoparticle thereof, or a silver halide particle can be used as the conductive material. Specifically, silver or copper which is low resistant is preferably used. However, in the case of using copper, an insulating film containing nitrogen is formed as a barrier film to prevent copper from spreading in a semiconductor-film or the like. In addition, ITO (indium tin oxide), IZO (indium zinc oxide) in which zinc oxide (ZnO) of from 2% to 20% is mixed into indium oxide, ITSO in which silicon oxide ($SiO_2$) of from 2% to 20% is mixed into indium oxide, organic indium, organo-tin, titanium nitride (TiN), or the like can also be used as a transparent conductive material.

A piezo method can be employed as an ink-jet method. The piezo method is utilized also for an ink-jet printer since it has superior ink-droplet controllability and a high degree of freedom for ink selection. Note that the piezo method has an MLP (Multi Layer Piezo) type and an MLChip (Multi Layer Ceramic Hyper Integrated Piezo Segments) type. Alternatively, an ink-jet method using a so-called thermal method which makes a heating element generate heat to generate bubbles, thereby pushing out a solution may be employed depending on a solvent material.

The thus formed wiring is provided with a conductive film with the photocatalytic substance therebetween.

The thus formed wiring can be used as a gate electrode, a source electrode, or a drain electrode of a thin film transistor (also referred to as a TFT), a wiring connected to the electrode, or a wiring to which a source signal, a drain signal, or a gate signal is inputted. Then, a semiconductor device having such a thin film transistor can be formed.

In addition, a photocatalystic substance that is formed except below the conductive film, that is, an unnecessary photocatalytic substance for forming a wiring may be removed. This is because $TiO_2$ is prevented from unnecessarily reacting when irradiated with light such as external light after forming a thin film transistor or a semiconductor device. A wet etching method or a dry etching method using the conductive film as a mask can be employed as a removing method. For example, $TiO_2$ can be removed by a wet etching method using an HF based etchant.

On the contrary, the photocatalytic substance may be left when a harmful organic material attaches to a thin film transistor or the like due to transfer between film formation chambers while forming a thin film transistor or the like since it becomes possible to remove the organic material. Therefore, the photocatalytic substance may be formed on the periphery (border, edge) of a display portion.

According to the present invention, a narrower wiring, that is, a smaller wiring in width than a diameter of a dot formed by an ink-jet method can be formed. Further, a wiring can be formed along a region in which photocatalytic activity is improved even in the case where a dot is discharged out of alignment to some extent. Thus, a position of a wiring to be formed can be controlled with accuracy. In addition, adjacent dots can be prevented from cohering, and thus, a wiring can be prevented from breaking by controlling a photocatalytic substance to be hydrophilic, oil-repellent, or the like. Further, a film thickness of a wiring can be made thick since a dot does not spread in a width direction.

As described above, large area patterning and high precision patterning becomes easy; use of a mask can be reduced; manufacturing steps can be simplified since a photolithography step can be omitted; and a material can be utilized efficiently, according to a method for manufacturing a wiring by an ink-jet method utilizing a photocatalytic reaction of the present invention. When an ink-jet method is used, a wiring can be formed even on a large substrate with low cost and with manufacturing steps shortened.

These and other objects, features and advantages of the present invention will become more apparent upon reading of the following detailed description along with the accompanied drawings.

DETAILED DESCRIPTION OF THE INVENTION

Figure 1A:
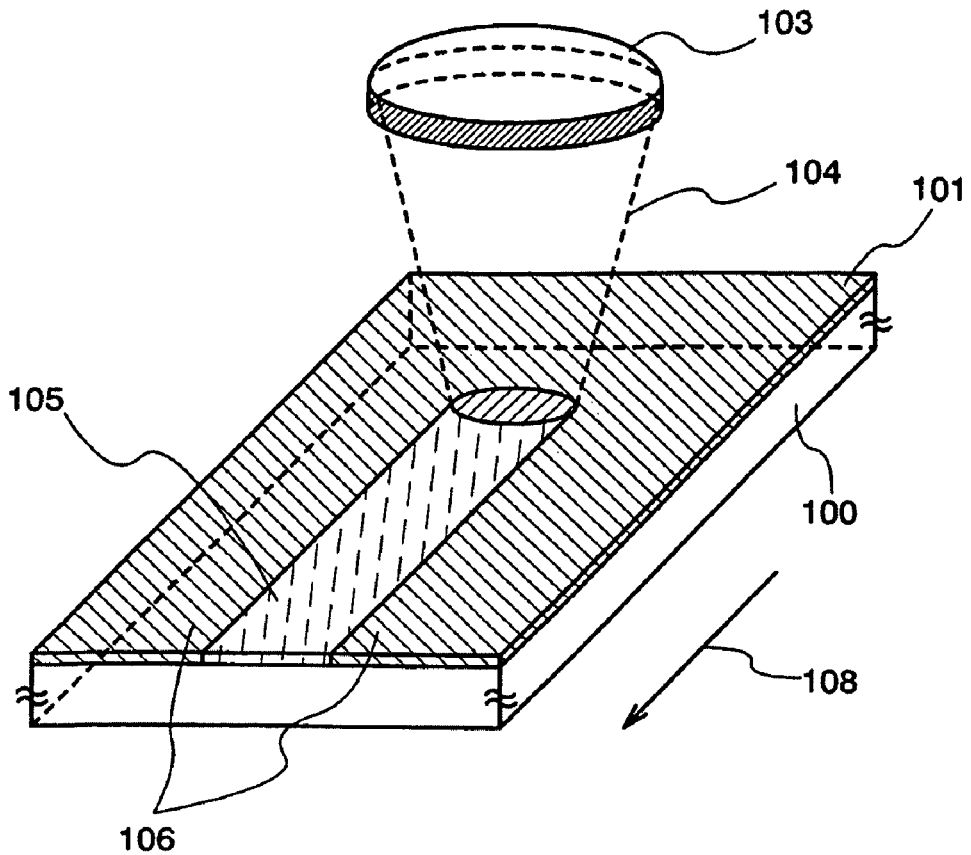
FIGS. 1A and 1B show a method for forming a wiring of the present invention.

Embodiment modes of the present invention are hereinafter described with reference to attached drawings. Note that the same reference numeral is given to the same portion or a portion having a similar function throughout whole diagrams for explaining embodiment modes, and repetitive description is omitted.

Embodiment Mode 1

A specific method for manufacturing a wiring is described in this embodiment mode.

As shown in FIG. 1A, a photocatalytic substance 101 is formed over a region 100 where a wiring is to be formed. The photocatalytic substance can be formed by a dip coating method of a sol-gel method, a spin coating method, an ink-jet method, an ion plating method, an ion beam method, a CVD method, a sputtering method, an RF magnetron sputtering method, a plasma spraying method, or an anodic oxidation method. In addition, the photocatalytic substance can be formed by mixing and melting a salt of a constituent element, in the case of a photocatalytic substance made of an oxide semiconductor including a plurality of metals. A solvent may be baked or dried when it is necessary to remove the solvent in the case of forming the photocatalytic substance by an application method such as a dip coating method or a spin coating method. Specifically, it may be heated at a predetermined temperature (for example, equal to or more than 300° C.), preferably, in an atmosphere including oxygen. For example, Ag is used as conductive paste and baking is performed in an atmosphere including oxygen and nitrogen; then, an organic material such as a thermosetting resin is decomposed. Therefore, Ag without containing an organic material can be obtained. Accordingly, planarity on the surface of Ag can be increased.

According to the heat treatment, the photocatalytic substance can have a predetermined crystal structure. For example, it has an anatase type or a rutile-anatase mixed type. The anatase type is preferentially formed in a low temperature phase. Therefore, the photocatalytic substance may be heated when it does not have a predetermined crystal structure. In addition, the photocatalytic substance can be formed plural times to obtain a predetermined film thickness in the case of being formed by an application method.

The case of forming $TiO_2$ crystal having a predetermined crystal structure by a sputtering method as a photocatalytic substance is described in this embodiment mode. Sputtering is performed using a metal titanium tube as a target and using an argon gas and oxygen. Further, a He gas may be introduced. The atmosphere is made to include much oxygen and formation pressure is set high to form $TiO_2$ having high photocatalytic activity. It is preferable to form $TiO_2$ while heating a film formation chamber or a substrate provided with an object to be treated.

Thus formed $TiO_2$ has a photocatalytic function even when it is a very thin film (approximately 1 μm).

Subsequently, light is converged by using an optical system to form an irradiation region by selectively performing light irradiation. For example, light 104 is converged by a lens 103. Then, light irradiation is selectively performed by relatively moving $TiO_2$ and the light. For example, the photocatalytic substance 101 may be moved in a direction of an arrow 108. Accordingly, an irradiation region 105 and a non-irradiation region 106 can be formed. $TiO_2$ in the irradiation region 105 shows a hydrophilic property. Note that it can be at once hydrophilic and oleophilic depending on a length of irradiation time.

A lamp (for example, an ultraviolet lamp, so-called black light) and laser light (for example, a XeCl excimer laser having an oscillation wavelength of 308 nm, a XeF excimer laser having an oscillation wavelength of 351 nm, a KrF excimer laser having an oscillation wavelength of 248 nm, or the like) can be used as the light. It is preferable to use laser light which can oscillate a particular wavelength. In addition, the light is only necessary to be light having such a wavelength that photocatalytically activates $TiO_2$, and $TiO_2$ can be selectively irradiated with light by using external light.

In this step, light irradiation is performed in a dark room or in a reaction room where at least a photocatalytically activating wavelength is removed or reduced to selectively perform light irradiation. At least a reaction chamber of an apparatus itself may be a dark room, or at least a photocatalytically activating wavelength may be removed or reduced.

In addition, light irradiation can be entirely performed by selectively forming $TiO_2$ in a region where a conductive material is to be formed. For example, $TiO_2$ is selectively formed by an ink-jet method, or a spin coating method with a metal mask having a desired shape arranged; thereafter, light irradiation may be entirely performed by using a lamp, laser light, or the like. Accordingly, selectively formed $TiO_2$ becomes hydrophilic.

$TiO_2$ can be prevented from unnecessarily reacting when irradiated with light such as external light after forming a thin film transistor or a semiconductor device by selectively forming $TiO_2$ in this way. Namely, a wet etching method or a dry etching method using a conductive film as a mask need not be used to remove $TiO_2$ which is formed except below the conductive film, that is, unnecessary $TiO_2$ for forming a wiring.

In addition, $TiO_2$ in a desired region where the conductive material is to be formed can be made hydrophilic by forming a protective film, selectively removing the protective film, and performing light irradiation after entirely forming $TiO_2$. A dry etching method or a wet etching method can be employed as a method for selectively removing the protective film. Alternatively, the protective film may be removed by laser ablation using laser light having equal to or more than certain power and having such a wavelength that photocatalytically activates $TiO_2$. In this case, selective removal of the protective film and photocatalytic activation of $TiO_2$ can be simultaneously performed. Subsequently, a material which absorbs or reflects light having equal to or less than certain power and a photocatalytically activating wavelength is selected for the protective film so that $TiO_2$ is not irradiated with light having a photocatalytically activating wavelength. Namely, the protective film is selected in consideration of being irradiated with light having a photocatalytically activating wavelength included in external light. As a result, $TiO_2$ can be prevented from being irradiated with light having a photocatalytically activating wavelength during transfer between reaction chambers or during use as a product. In addition, a material used as the protective film can absorb or reflect light having a photocatalytically activating wavelength by controlling a film thickness. Further, the protective film can be formed by laminating a plurality of materials. Accordingly, it can widely absorb or reflect light having a photocatalytically activating wavelength.

In this way, $TiO_2$ can be selectively made hydrophilic. A width of a hydrophilic region can be a desired width of a wiring, and a light irradiation region can be narrowed by the optical system.

Figure 1B:
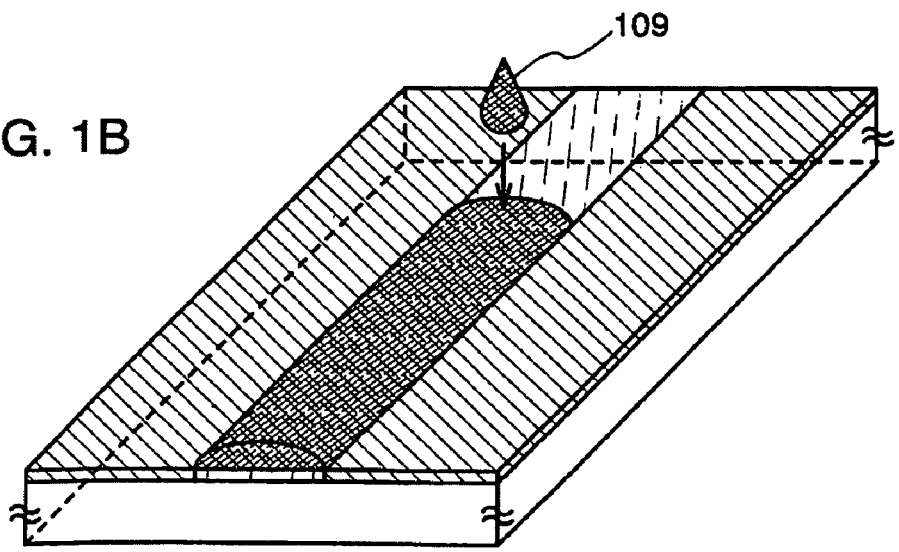

Thereafter, a dot 109 is discharged from above the irradiation region as shown in FIG. 1B. A dot discharge means has a head provided with one or a plurality of solution inlets and one or a plurality of nozzles. A composition to be a material of a dot is injected from the solution inlet, and the composition is discharged from the nozzle. At this time, the composition is discharged to be a dot shape or a linear shape of a series of dots; however, they are collectively referred to as a dot. In other words, discharging a dot means to continuously discharge a plurality of dots; therefore, dots may be discharged to be a linear shape without being recognized as a dot.

A diameter of the nozzle is preferably set from 0.02 μm to 100 μm (preferably, equal to or less than 30 μm), and the quantity of the composition discharged from the nozzle is preferably set from 0.001 pl to 100 pl (preferably, equal to or less than 10 pl). The quantity to be discharged can be controlled by the diameter size of the nozzle. Therefore, the diameter of the nozzle can be designed in accordance with a desired width of a wiring. In addition, a distance between a surface of a hydrophilic region, that is, a surface of an object to be treated and an outlet of the nozzle is preferably close to drop at a desired position. Preferably, it is set about from 0.1 mm to 3 mm (preferably, from 0.5 mm to 2 mm).

A conductive material mixed into a solvent is used as the composition discharged from the outlet. Gold, silver, copper, platinum, palladium, tungsten, nickel, tantalum, bismuth, lead, indium, tin, zinc, titanium, aluminum, an alloy thereof, a dispersive nanoparticle thereof, or a silver halide particle can be used as the conductive material. Specifically, silver or copper which is low resistant is preferably used. However, in the case of using copper, an insulating film containing nitrogen is formed as a barrier film to prevent copper from spreading in a semiconductor film or the like. In addition, ITO (indium tin oxide), IZO (indium zinc oxide) in which zinc oxide (ZnO) of from 2% to 20% is mixed into indium oxide, ITSO in which silicon oxide ($SiO_2$) of from 2% to 20% is mixed into indium oxide, organic indium, organotin, titanium nitride (TiN), or the like can also be used as a transparent conductive material.

A water-based or oil (alcohol) based solvent can be used as the solvent. In the case of using a water-based solvent, it is preferable to add a surfactant in order to smoothly discharge the composition from the nozzle. In this embodiment mode, the photocatalytic substance is controlled to be hydrophilic; therefore, a detail of an oil (alcohol) based solvent is described in the following embodiment mode.

The surface tension of the composition is preferably equal to or less than 40 mN/m. The viscosity of the composition is preferably equal to or less than 50 cp. This is because the composition is prevented from drying or the composition is smoothly discharged from the outlet. Note that the viscosity of the composition and the like may be appropriately adjusted in accordance with a solvent to be used and intended use. For example, the viscosity of a composition in which ITO, organic indium, or organotin is dissolved or dispersed in the solvent is from 5 mPa·S to 50 mPa·S, the viscosity of a composition in which silver is dissolved or dispersed in the solvent is from 5 mPa·S to 20 mPa·S, and the viscosity of a composition in which gold is dissolved or dispersed in the solvent is from 10 mPa·S to 20 mPa·S.

The diameter of a particle of the conductive material is preferably smaller for the purpose of preventing clogged nozzles and manufacturing a high-definition pattern, although it depends on the diameter of each nozzle, a desired width of a pattern, and the like. Preferably, the diameter of the particle of the conductive material is equal to or less than 0.1 μm.

The composition is formed by an electrolyzing method, an atomizing method, a wet reducing method, or the like, and the particle size thereof is typically about from 0.5 μm to 10 μm. However, in the case of using a gas evaporation method, each nanomolecule protected with a dispersing agent is minute, about 7 nm. When each surface of particles is covered with a coating, the nanoparticles do not cohere in the solvent but are uniformly dispersed in the solvent at a room temperature, and show a property similar to that of liquid.

The step of discharging the composition is preferably performed under reduced pressure. The solvent of the composition is evaporated during a period from discharging the composition until the composition lands on an object to be treated, and thus, steps of drying and baking the composition can be both omitted. It is preferable to perform the step under reduced pressure, since an oxide film or the like is not formed on the surface of the conductive material.

After discharging the composition, one step of or both steps of drying and baking is/are performed. Each step of drying and baking is a step of heat treatment. For example, drying is performed for three minutes at 100° C. and baking is performed for from 15 minutes to 30 minutes at a temperature of from 200° C. to 350° C. The steps of drying and baking are performed at normal pressure or under reduced pressure by laser light irradiation, rapid thermal annealing, a heating furnace, or the like.

The substrate may be heated to efficiently perform the steps of drying and baking. The temperature of the substrate at the time depends on a material of the substrate or the like, but it is typically from 100° C. to 800° C. (preferably, from 200° C. to 350° C.). According to the steps, fusion between nanoparticles to be in contact with one another is accelerated by hardening and shrinking as well as evaporating solvent or solution in the composition or chemically removing the dispersing agent.

Thus, a narrower wiring, that is, a smaller wiring in width than a diameter of a dot can be formed by an ink-jet method utilizing a photocatalytic reaction. Further, a wiring can be formed along the region in which photocatalytic activity is increased even in the case where a dot is discharged out of alignment to some extent. Thus, a position of a wiring to be formed can be controlled with accuracy.

Further, a semiconductor film or an insulating film may be formed by an ink-jet method utilizing a photocatalytic reaction, and metal sulfide of Cd or Zn, or oxide of Fe, Ti, Si, Ge, Zr, Ba, or the like can be dropped.

In addition, a plug for connecting wirings can be formed by an ink-jet method utilizing a photocatalytic reaction. An opening is formed in the insulating film to be provided with the plug; a photocatalytic substance is formed only on a side face of the opening or on the surface of the insulating film in the vicinity of the opening; the photocatalytic substance is controlled to be hydrophilic or the like by light irradiation; and a plug material can be actively dropped into the opening.

Embodiment Mode 2

The case of using an oil (alcohol) based solvent as a solvent of a conductive material is described in this embodiment mode.

Figure 2A:
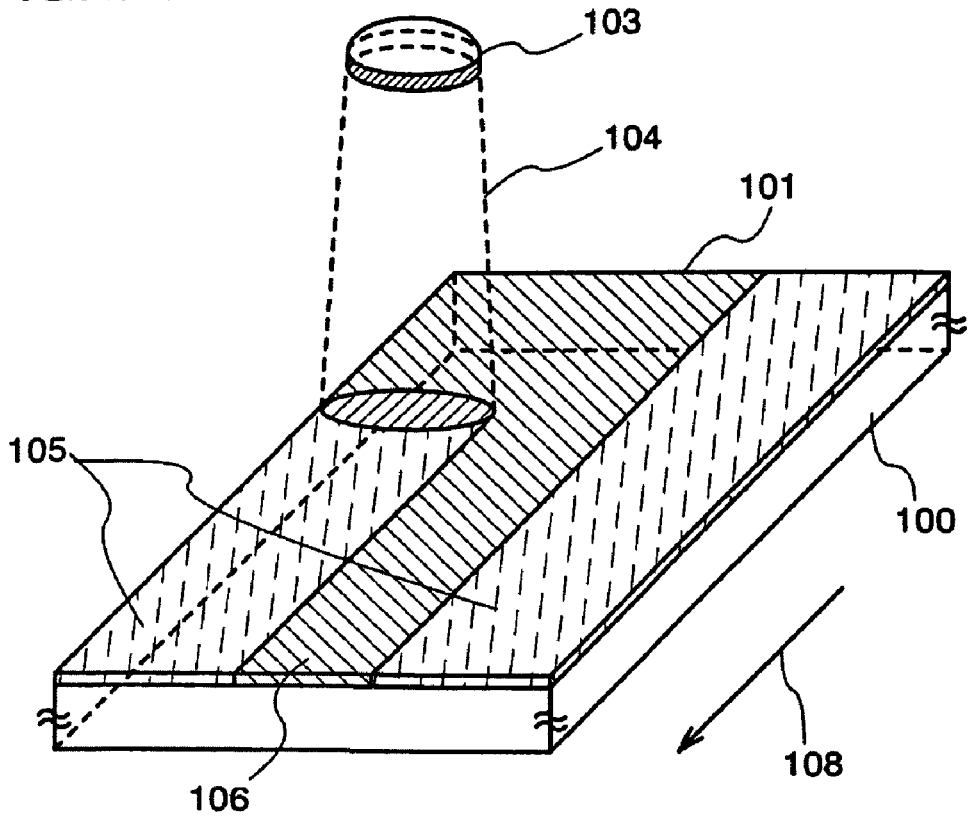
FIGS. 2A and 2D show a method for forming a wiring of the present invention.

A photocatalytic substance 101 is formed over a region 100 where a wiring is to be formed as described in Embodiment Mode 1 and as shown in FIG. 2A. Subsequently, light is converged by using an optical system to selectively irradiate with light. For example, light irradiation is selectively performed by converging light 104 with a lens 103 and relatively moving $TiO_2$ and the light. For example, the photocatalytic substance 101 may be moved in a direction of an arrow 108. Accordingly, an irradiation region 105 and a non-irradiation region 106 can be formed. Then, $TiO_2$ in the irradiation region 105 shows an oil-repellent property.

Figure 2B:
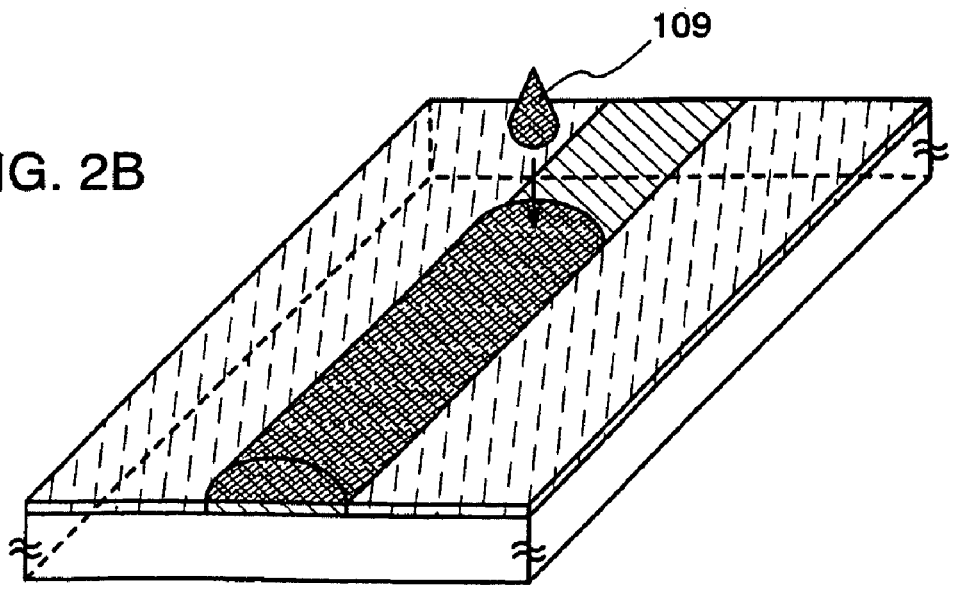

Thereafter, a dot 109 is discharged from above the non-irradiation region as shown in FIG. 2B. An oil (alcohol) based solvent is used as the solvent of the conductive material in this embodiment mode; therefore, a dot is discharged from above the non-irradiation region provided between the irradiation regions to the non-irradiation region. Note that discharging a dot means to continuously discharge a plurality of dots; therefore, dots may be discharged to be a linear shape without being recognized as a dot.

A nonpolar solvent or a low polar solvent can be used as the oil (alcohol) based solvent. For example, terpineol, mineral spirit, xylene, toluene, ethyl benzene, mesitylene, hexane, heptane, octane, decane, dodecane, cyclohexane, or cyclooctane can be used. Tetradecane is used for the solvent in this embodiment mode. In addition, a similar material to that in the above embodiment mode can be used as the conductive material.

Subsequently, a wiring is formed by drying or baking as in the above embodiment mode.

Thus, a narrower wiring, that is, a smaller wiring in width than a diameter of a dot can be formed by an ink-jet method utilizing a photocatalytic reaction. Further, a wiring can be formed along the region in which photocatalytic activity is increased even in the case where a dot is discharged out of alignment to some extent. Thus, a position of a wiring to be formed can be controlled with accuracy.

Height of the wiring can be increased by making the region where a wiring is to be formed oil-repellent. In other words, the height of the wiring can be more heightened compared to the above embodiment mode since a dot including a conductive material mixed into the oil (alcohol) based solvent is dropped between the non-irradiation regions.

Further, a semiconductor film or an insulating film may be formed by an ink-jet method utilizing a photocatalytic reaction, and metal sulfide of Cd or Zn, or oxide of Fe, Ti, Si, Ge, Zr, Ba, or the like can be dropped.

In addition, a plug for connecting wirings can also be formed by an ink-jet method utilizing a photocatalytic reaction. An opening is formed in the insulating film to be provided with the plug; a photocatalytic substance is formed only on a side face of the opening or on the surface of the insulating film in the vicinity of the opening; the photocatalytic substance is controlled to be hydrophilic or the like by light irradiation; and a plug material can be actively dropped into the opening.

Embodiment Mode 3

An example of forming a thin film transistor by using a method for manufacturing a wiring described in the above embodiment mode is described in this embodiment mode. Note that $TiO_2$ is used as a photocatalytic substance.

Figure 3A:
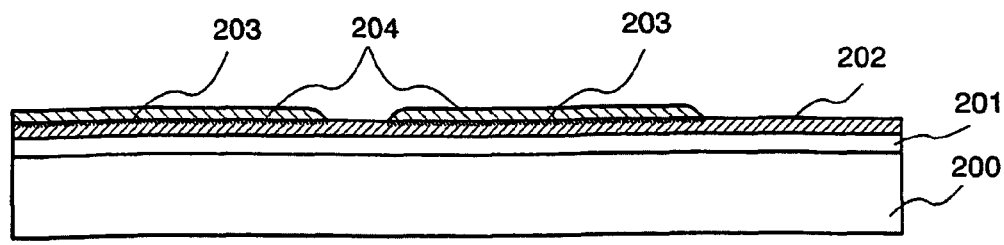
FIGS. 3A to 3D are cross-sectional views showing a step of manufacturing a thin film transistor of the present invention.

First, a base film 201 is formed over a substrate 200 having an insulating surface (over an insulating surface) as shown in FIG. 3A. A glass substrate such as barium borosilicate glass or aluminoborosilicate glass, a quartz substrate, a stainless steel substrate, or the like can be used as the substrate 200. Although a substrate made of a flexible synthetic resin such as plastics typified by polyethylene-terepbthalate (PET), polyethylenenaphthalate (EN), or polyeter sulfone (PES) or acrlyic generally tends to have a lower heat resistance temperature compared to other substrates, it can be used as the substrate 200 as long as it can withstand the process temperature in the manufacturing step.

The base film 201 is formed in order to prevent an alkaline metal such as Na or an alkaline earth metal, contained in the substrate 200 from spreading in a semiconductor film and exerting an adverse influence on semiconductor element characteristics. The base film 201 is therefore formed by using an insulating film, such as silicon oxide, silicon nitride, or silicon nitride oxide, capable of suppressing the spread of an alkaline metal or an alkaline earth metal into the semiconductor film. Note that the base film 201 can have a laminated structure. In this embodiment mode, a silicon oxynitride film formed as a first base film by a plasma CVD method with $SiH_4$, $N_2O$, $NH_3$, or $N_2$ used as a material gas, pressure of 0.3 Torr (39.9 Pa), RF power of 50 W, an RF frequency of 60 MHz, a substrate temperature of 400° C. to be from 10 nm to 200 nm, (preferably, from 50 nm to 200 nm) in thickness, and a silicon oxynitride film formed as a second base film by a plasma CVD method with $SiH_4$ or $N_2O$ used as a material gas, pressure of 0.3 Torr (39.9 Pa), RF power of 150 W, an RF frequency of 60 MHz, a substrate temperature of 400° C. to be from 50 nm to 200 nm (preferably, from 150 nm to 200 nm) in thickness are sequentially laminated.

It is effective to provide a base film in order to prevent impurity spread in the case of using a substrate that contains a certain amount of an alkaline metal or an alkaline earth metal, such as a glass substrate or a plastic substrate. However, a base film is not necessarily required to be provided when using a quartz substrate or the like, with which impurity spread does not cause a problem.

$TiO_2$ is formed as a photocatalytic substance 202 over an entire surface of the base film. In addition, $TiO_2$ can be used as the base film; in this case, the base film can be omitted. $TiO_2$ may be formed as in the above embodiment mode. In this embodiment mode, $TiO_2$ having a predetermined crystal structure is formed by baking or drying after forming $TiO_2$ by a spin coating method. For example, it has an anatase type or a rutile-anatase mixed type.

Subsequently, an irradiation region 203 is formed by irradiating $TiO_2$ in a desired region with light having a photocatalytically activating wavelength. Then, the irradiation region shows a hydrophilic property.

A dot including a conductive material dispersed in a solvent is dropped from above the irradiation region to the irradiation region by an ink-jet method. In this embodiment mode, a dot is dropped on the irradiation region by using a water-based solvent and using Ag as the conductive material. Subsequently, it is baked by being heated at from 150° C. to 400° C., thereby forming a wiring 204. The wiring 204 functions as a so-called source electrode or drain electrode.

Figure 3B:
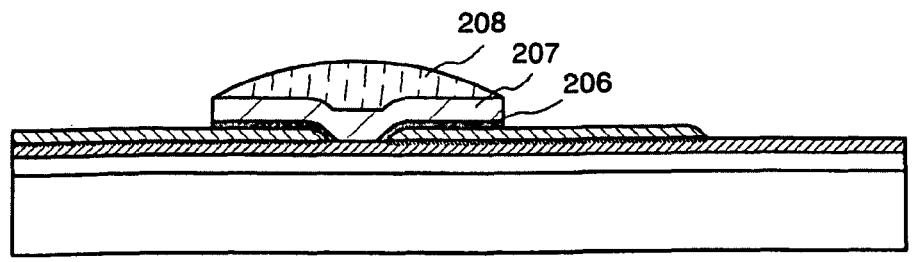

A semiconductor film having one conductivity, for example, a semiconductor film having N-type conductivity 206 is formed by a plasma CVD method as shown in FIG. 3B. Thereafter, the semiconductor film having N-type conductivity is patterned to prevent a short circuit between wirings.

Subsequently, a semiconductor film 207 is formed by a plasma CVD method. A film thickness of the semiconductor film 207 is from 25 nm to 200 nm (preferably, from 30 nm to 60 nm). In addition, silicon germanium as well as silicon can be used for an amorphous semiconductor. In the case of using silicon germanium, a concentration of germanium is preferably set about from 0.01 atomic % to 4.5 atomic %. In addition, either semiconductor film selected from a semi-amorphous semiconductor in which a crystal grain is dispersed in the amorphous semiconductor and a microcrystal semiconductor in which a crystal grain of from 0.5 nm to 20 nm can be observed in the amorphous semiconductor may be used. A crystal in which a crystal grain of from 0.5 nm to 20 nm can be observed is referred to as so-called microcrystal (μc). In this embodiment mode, an amorphous semiconductor film containing silicon as its main component (also referred to as an amorphous silicon film) is used.

Thereafter, a photomask 208 is formed, and the semiconductor film and the semiconductor film having N-type conductivity are patterned by using the mask. For example, the photomask can be formed by dropping polyimide, polyvinyl alcohol, or the like by an ink-et method.

Figure 3C:
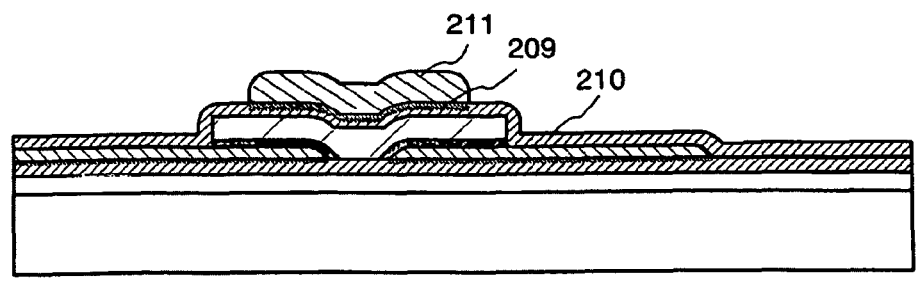

An insulating film, that is, a so-called gate insulating film 210 is formed as shown in FIG. 3C. In this embodiment mode, $TiO_2$ is applied by a spin coating method to be used as the gate insulating film. $TiO_2$ is suitable for the gate insulating film since it has a high dielectric constant. Then, an irradiation region 209 is formed by irradiating a desired wiring formation region, that is, a region where the gate insulating film is to be formed with light having a photocatalytically activating wavelength. The irradiation region 209 shows a hydrophilic property.

A dot including a conductive material mixed into a solvent is dropped from above the irradiation region to the irradiation region by an ink-jet method. In this embodiment mode, a dot is dropped on the irradiation region by using a water-based solvent and using Ag as the conductive material. Subsequently, it is heated at from 150° C. to 400° C. to form a gate electrode 211.

Alternatively, a dot including a conductive material mixed into an oil (alcohol) based solvent may be dropped. In this case, opposite ends of a region where the gate electrode is formed may be irradiated with light having a photocatalytically activating wavelength to be more oil-repellent.

Figure 3D:
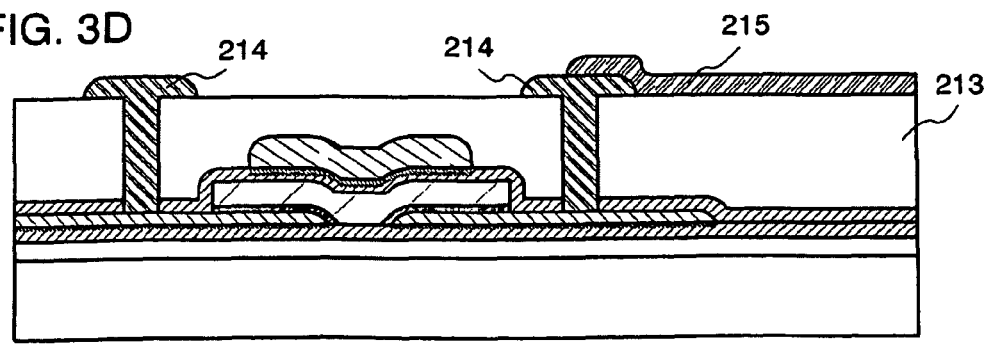

An interlayer insulating film 213 is formed if necessary as shown in FIG. 3D. An inorganic material (silicon oxide, silicon nitride, silicon oxynitride, or the like), a photosensitive or non-photosensitive organic material (polyimide, acrylic, polyamide, polyimidamide, a resist, or benzocyclobutene), a material in which a skeletal structure is configured by a bond of silicon (Si) and oxygen (O) and which contains at least hydrogen as a substituent, or which further contains at least one kind of fluorine, an alkyl group, and aromatic hydrocarbon as a substituent, that is, so-called siloxane, or a laminated structure thereof can be used as the interlayer insulating film. A positive photosensitive organic resin or a negative photosensitive organic resin can be used as the organic material. For example, when a positive photosensitive acrylic is used as the organic material, an opening having a curvature in its top edge portion can be formed by etching the photosensitive organic resin with light-exposure treatment. In this embodiment mode, a silicon oxynitride film is formed by a plasma CVD method using $SiH_4$ or $N_2O$ as a material gas to be 600 nm in thickness.

Subsequently, an opening, that is, a so-called contact hole is formed in the interlayer insulating film 213. A wiring 214 is formed in the contact hole and is electrically connected to the wiring 204. The wiring 214 can be formed by an ink-jet method. The wiring 214 functions as a so-called source wiring or drain wiring.

Note that the wiring 214 may be laminated first by an ink-jet method, and then, an insulating film having high viscosity may be formed to form the interlayer insulating film. In addition, the insulating film and the wiring may be appropriately alternately dropped by an ink-jet method. In other words, an insulating film material is dropped; then, a wiring material is dropped in a region where the wiring is to be formed. When surface planarity at this time becomes a problem, a planarization step such as CMP (Chemical Mechanical Polishing) or etchback may be performed. As described above, a photomask formation step for opening a contact hole, an etching step using the mask, a washing step for removing the mask can be reduced.

Thereafter, an electrode 215 is formed to be in contact with the wiring 214. The electrode 215 can be formed by an ink-jet method. The electrode 215 functions as a so-called pixel electrode in a liquid crystal display device and functions as a so-called anode or cathode of a light emitting element in a light emitting device. A dot including a conductive material mixed into a water-based solvent can be used as the electrode 215. Specifically, a transparent conductive film can be formed by using a dot including a transparent conductive material mixed into the solvent. In addition, $TiO_2$ is formed on a top face of the interlayer insulating film 213, and a desired region where the electrode 215 is to be formed may be irradiated with light having a photocatalytically activating wavelength to be hydrophilic.

Alternatively, a dot including a conductive material mixed into an oil (alcohol) based solvent may be dropped. In this case, opposite ends of the region where the electrode 215 is to be formed may be irradiated with light having a photocatalytically activating wavelength to be more oil-repellent.

In addition, it is preferable to form the interlayer insulating film 213 since planarity is enhanced; on the other hand, manufacturing steps are increased. Therefore, a contact hole may be formed in the gate insulating film 210 without forming the interlayer insulating film 213 and the electrode 215 may be formed.

Thus, a thin film transistor having a narrower wiring, that is, a smaller wiring in width than a diameter of a dot can be formed by an ink-jet method utilizing a photocatalytic reaction. The thin film transistor of this embodiment mode is a so-called top gate thin film transistor in which a gate electrode is provided above a semiconductor film.

In addition, unnecessary TiO$_2$ may be removed in this embodiment mode. An unnecessary region means a region where a wiring is not formed; therefore, TiO$_2$ can be removed by dry etching or wet etching using a wiring as a mask.

Embodiment Mode 4

An example of forming a thin film transistor by a different method from that of the above embodiment mode is described in this embodiment mode. Note that TiO$_2$ is used as a photocatalytic substance.

Figure 4A:
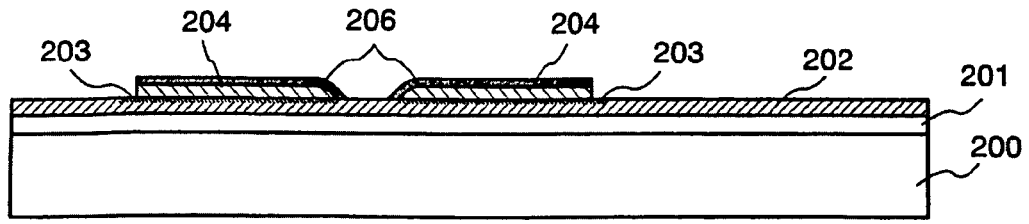
FIGS. 4A to 4C are cross-sectional views showing a step of manufacturing a thin film transistor of the present invention.

First, a base film 201 is formed over a substrate 200 as in the above embodiment mode and as shown in FIG. 4A. TiO$_2$ is formed as the photocatalytic substance 202 over an entire surface of the base film. In addition, TiO$_2$ can be used as the base film; in this case, the base film can be omitted. TiO$_2$ may be formed as described in the above embodiment mode.

Subsequently, an irradiation region 203 is formed by irradiating TiO$_2$ in a desired region with light having a photocatalytically activating wavelength. Then, the irradiation region shows a hydrophilic property.

A dot including a conductive material mixed into a solvent is dropped from above the irradiation region to the irradiation region by an ink-jet method to form a wiring 204. A semiconductor film having one conductivity, for example, a semiconductor film having N-type conductivity 206 is formed, and the wiring 204 and the semiconductor film having N-type conductivity 206 are simultaneously patterned.

Figure 4B:
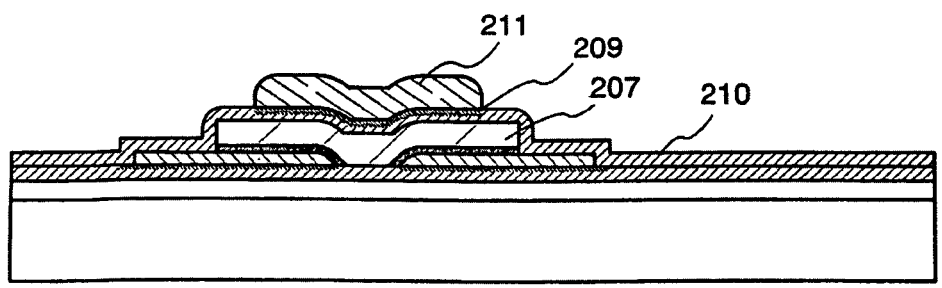

A semiconductor film 207 is formed over the semiconductor film having N-type conductivity and is patterned as shown in FIG. 4B. For example, an amorphous semiconductor film is used as the semiconductor film, a mask made of polyimide, polyvinyl alcohol, or the like is formed over the amorphous semiconductor film by an ink-jet method, and the amorphous semiconductor film is patterned by using the mask. At this time, the semiconductor film having N-type conductivity may be patterned at the same time. Thereafter, a gate insulating film 210 is formed to cover the semiconductor film and the like. An irradiation region 209 is formed by using TiO$_2$ as the gate insulating film and irradiating a desired region with light having a photocatalytically activating wavelength. Then, the irradiation region 209 shows a hydrophilic property.

A dot including a conductive material mixed into a solvent is dropped from above the irradiation region to the irradiation region by an ink-jet method to form a gate electrode 211. A water-based solvent is used to selectively drop a dot on the hydrophilic region.

Alternatively, a dot including a conductive material dispersed in an oil (alcohol) based solvent may be dropped. In this case, opposite ends of a region where the gate electrode 211 is to be formed may be irradiated with light having a photocatalytically activating wavelength to be more oil-repellent.

Figure 4C:
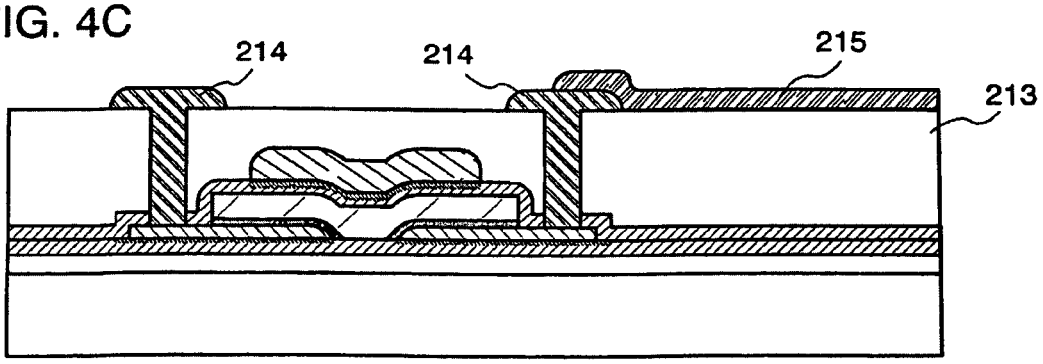

As shown in FIG. 4C, an interlayer insulating film 214 is formed, a contact hole is formed in a desired region, and a wiring 214 is formed in the contact hole. The wiring 214 can be formed by an ink-jet method. Then, an electrode 215 is formed to connect to the wiring 214. The electrode 215 can be formed by an ink-jet method.

The electrode 215 functions as a pixel electrode in a liquid crystal display device and functions as an anode or a cathode of a light emitting element in a light emitting device. A conductive material dispersed in a water-based solvent can be used as the electrode 215. Specifically, a transparent conductive film can be formed by using a transparent conductive material. In addition, TiO$_2$ is formed on a top face of the interlayer insulating film 213, and a desired region where the electrode 215 is to be formed may be irradiated with light having a photocatalytically activating wavelength.

Alternatively, a dot including a conductive material mixed into an oil (alcohol) based solvent may be dropped. In this case, opposite ends of the region where the electrode 215 is to be formed may be irradiated with light having a photocatalytically activating wavelength to be more oil-repellent.

In addition, it is preferable to form the interlayer insulating film 213 since planarity is enhanced; on the other hand, manufacturing steps are increased. Therefore, a contact hole may be formed in the gate insulating film 210 without forming the interlayer insulating film 213 and the electrode 215 may be formed.

Thus, a thin film transistor having a narrower wiring, that is, a smaller wiring in width than a diameter of a dot can be formed by an ink-jet method utilizing a photocatalytic reaction. The thin film transistor of this embodiment mode is a so-called top gate thin film transistor in which a gate electrode is provided above a semiconductor film.

In addition, unnecessary TiO$_2$ may be removed in this embodiment mode. An unnecessary region means a region where a wiring is not formed; therefore, TiO$_2$ can be removed by dry etching or wet etching using a wiring as a mask.

As described above, top gate thin film transistors having various structures can be formed.

Embodiment Mode 5

An example of forming a thin film transistor by a different method from that of the above embodiment mode is described in this embodiment mode. Note that TiO$_2$ is used as a photocatalytic substance.

First, a base film 201 is formed over a substrate 200 as described in the above embodiment mode and as shown in FIG. 4A. An electrode 215 is formed over the base film. The electrode 215 can be formed by an ink-jet method. In addition, a photocatalytic substance is used for the base film, and is irradiated with light to be hydrophilic or oil-repellent. Then, the electrode 215 may be dropped by an ink-jet method.

A wiring 204 is entirely formed, and a semiconductor film having one conductivity, for example, a semiconductor film having N-type conductivity 206 is formed. The wiring 204 can be formed by a sputtering method or an ink-jet method. Thereafter, TiO$_2$ is formed as the photocatalytic substance 202 over the semiconductor film having N-type conductivity. An irradiation region 203 is formed by irradiating TiO$_2$ in a desired region with light. The irradiation region shows a hydrophilic property.

Then, a mask 208 made of polyimide, polyvinyl alcohol, or the like is formed over the semiconductor film having N-type conductivity by an ink-jet method. At this time, a mask is formed over the irradiation region. Therefore, the mask is formed by dropping a dot having a water-based solvent. Accordingly, a narrower mask than a diameter of a dot can be formed and minute patterning can be performed. Further, heat treatment may be performed if necessary to bake the mask.

Figure 17A:
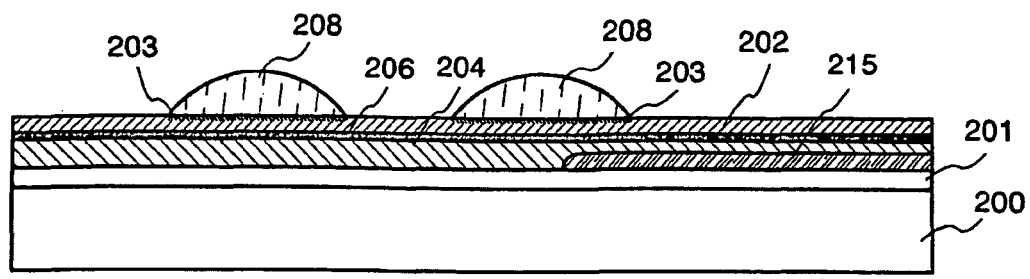
FIGS. 17A to 17C are cross-sectional views showing a step of manufacturing a thin film transistor of the present invention.
Figure 17B:
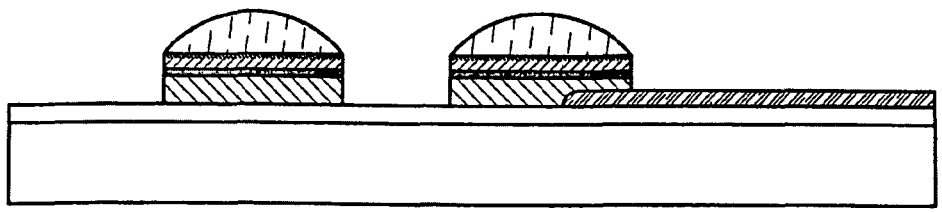

The wiring, the semiconductor film having N-type conductivity, and the photocatalytic substance are patterned by using the mask as shown in FIG. 17B. The electrode 215 appears by the patterning. Subsequently, washing is performed to remove the mask. Further, the photocatalytic substance is removed by wet etching or dry etching.

Figure 17C:
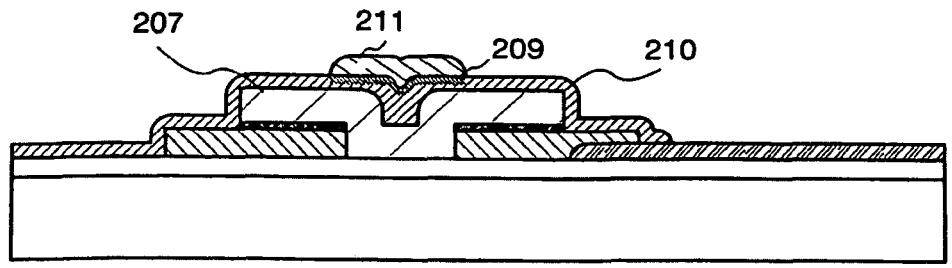

A semiconductor film 207 is formed and is patterned by using the mask, as shown in FIG. 17C. Although not shown, the mask may be formed by dropping polyimide, polyvinyl alcohol, or the like on the semiconductor film by an ink-jet method. When the semiconductor film is patterned, the semiconductor film having N-type conductivity may be patterned at the same time.

Then, an insulating film which functions as a gate insulating film 210 is formed to cover the semiconductor film. At this time, the insulating film is not formed over the electrode 215. In this embodiment mode, the gate insulating film is formed by using $TiO_2$ which is the photocatalytic substance. An irradiation region 209 is formed by irradiating $TiO_2$ in a desired region with light. The irradiation region shows a hydrophilic property. Then, a conductive film which functions as a gate electrode 211 is formed over the irradiation region. Therefore, the conductive film is formed by dropping a dot including a conductive material mixed into a water-based solvent. Accordingly, a smaller gate electrode in width than a diameter of a dot can be formed, and miniaturization can be achieved. Further, heat treatment may be performed if necessary to bake the gate electrode.

As described above, top gate thin film transistors having various structures can be formed.

Embodiment Mode 6

An example of forming a thin film transistor by a different method from that of the above embodiment mode is described in this embodiment mode. Note that $TiO_2$ is used as a photocatalytic substance.

Figure 5A:
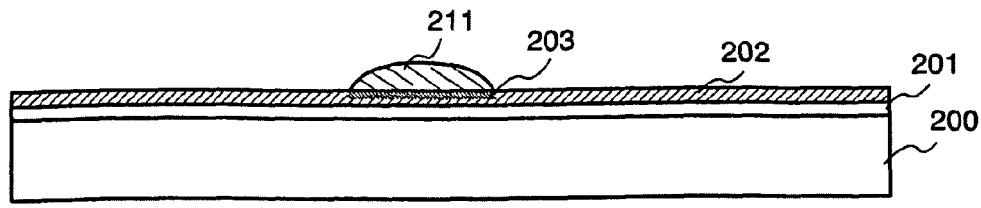
FIGS. 5A to 5D are cross-sectional views showing a step of manufacturing a thin film transistor of the present invention.

First, a base film 201 is formed over a substrate 200 as described in the above embodiment mode and as shown in FIG. 5A. $TiO_2$ is entirely formed over the base film as the photocatalytic substance 202. In addition, $TiO_2$ can be used as the base film; in this case, the base film can be omitted. $TiO_2$ may be formed as in the above embodiment mode.

Subsequently, an irradiation region 203 is formed by irradiating $TiO_2$ in a desired region with light having a photocatalytically activating wavelength. Then, the irradiation region shows a hydrophilic property.

A conductive film which functions as a gate electrode 211 is formed by dropping a dot including a conductive material mixed into a solvent from above the irradiation region, using an ink-jet method.

Figure 5B:
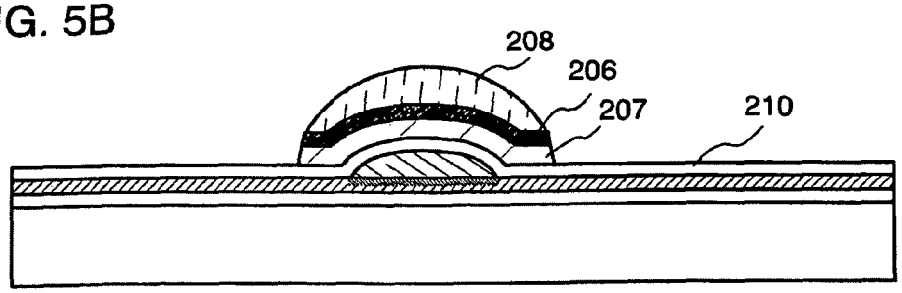

A gate electrode 210 is formed to cover the gate electrode as shown in FIG. 5B. Thereafter, a semiconductor film 207 and a semiconductor film having one conductivity, for example, a semiconductor film having N-type conductivity 206 are formed by a plasma CVD method or the like. At this time, the semiconductor film 207 and the semiconductor film having N-type conductivity 206 can be continuously formed by changing a material gas and a flow rate thereof. A mask 208 made of polyimide, polyvinyl alcohol, or the like is formed over the semiconductor film having N-type conductivity by an ink-jet method, and the semiconductor film and the semiconductor film having N-type conductivity are patterned by using the mask. Thereafter, washing is performed to remove the mask.

Figure 5C:
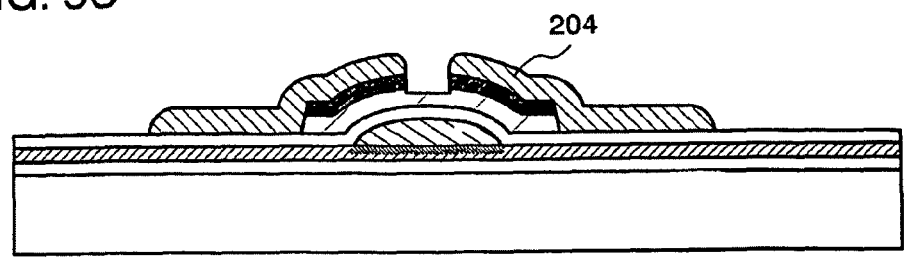

A wiring 204 is formed as shown in FIG. 5C. The wiring 204 can be formed by an ink-jet method. The wiring 204 functions as a so-called source electrode or drain electrode.

At this time, $TiO_2$ is formed in a region where the wiring 204 is to be formed and is irradiated with light having a photocatalytically activating wavelength to be hydrophilic, and the wiring may be formed by dropping a dot having a water-based solvent.

Alternatively, the wiring can be formed by forming $TiO_2$ at opposite ends where the wiring is to be formed, irradiating $TiO_2$ with light having a photocatalytically activating wavelength to be oil-repellent, and dropping a dot having an oil (alcohol) based solvent.

Thereafter, the wiring 204 is separated by using the wiring 204 as a mask and etching the semiconductor film having N-type conductivity. At this time, the semiconductor film may be etched to some extent. Preferably, a protect film is formed to cover the etched semiconductor film. For example, polyimide or the like may be dropped by an ink-jet method on the etched region of the semiconductor film.

Figure 5D:
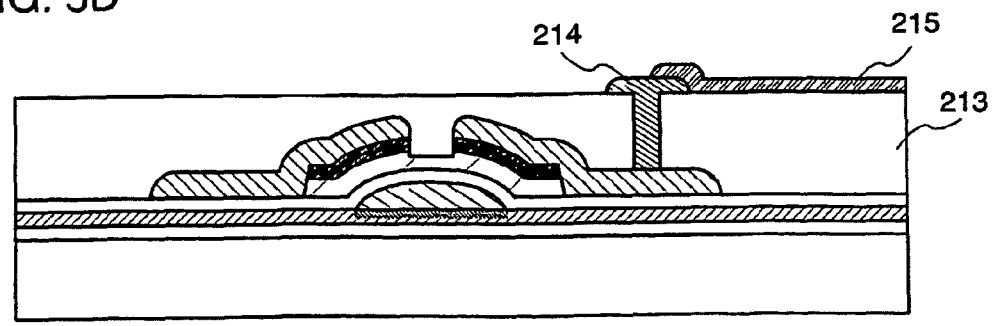

As shown in FIG. 5D, an interlayer insulating film 213 is formed, a contact hole is formed in a desired region, and a wiring 214 is formed in the contact hole. The wiring 214 can be formed by an ink-jet method. Then, an electrode 215 is formed to connect to the wiring 214. The electrode 215 can be formed by an ink-jet method.

The electrode 215 functions as a pixel electrode in a liquid crystal display device and functions as an anode or a cathode of a light emitting element in a light emitting device. A dot including a conductive material mixed into a water-based solvent can be used as the electrode 215. Specifically, a transparent conductive film can be formed by using a transparent conductive material. In addition, $TiO_2$ is formed on a top face of the interlayer insulating film 213, and a desired region where the electrode 215 is to be formed may be irradiated with light having a photocatalytically activating wavelength.

In addition, a dot including a conductive material dispersed in an oil (alcohol) based solvent may be dropped. In this case, opposite ends of the region where the electrode 215 is to be formed may be irradiated with light having a photocatalytically activating wavelength to be more oil-repellent.

In addition, it is preferable to form the interlayer insulating film 213 since planarity is enhanced; on the other hand, manufacturing steps are increased. Therefore, a contact hole may be formed in the gate insulating film 210 without forming the interlayer insulating film 213 to form the electrode 215.

Thus, a thin film transistor having a narrower wiring, that is, a smaller wiring in width than a diameter of a dot can be formed by an ink-jet method utilizing a photocatalytic reaction. The thin film transistor of this embodiment mode is a so-called bottom gate thin film transistor in which a gate electrode is provided below a semiconductor film and a so-called channel etch thin film transistor in which a channel region is etched.

In addition, unnecessary $TiO_2$ may be removed in this embodiment mode. An unnecessary region means a region where a wiring is not formed; therefore, $TiO_2$ can be removed by dry etching or wet etching using a wiring as a mask.

Embodiment Mode 7

An example of forming a thin film transistor by a different method from that of the above embodiment mode is described in this embodiment mode. Note that $TiO_2$ is used as a photocatalytic substance.

Figure 6A:
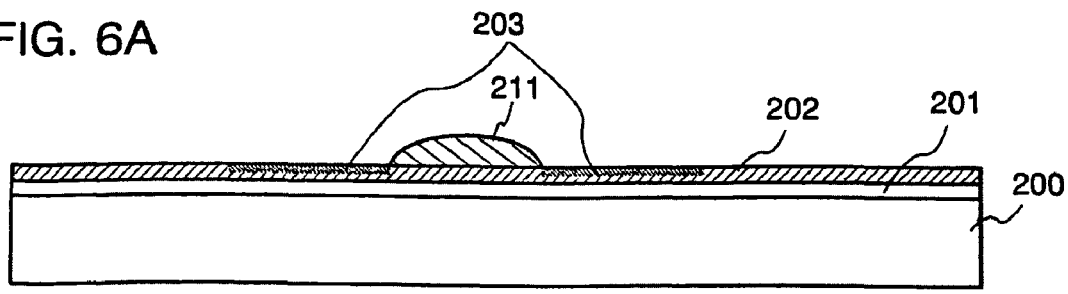
FIGS. 6A to 6D are cross-sectional views showing a step of manufacturing a thin film transistor of the present invention.

First, a base film 201 is formed over a substrate 200 as described in the above embodiment mode and as shown in FIG. 6A. $TiO_2$ is entirely formed over the base film as the photocatalytic substance 202. In addition, $TiO_2$ can be used as the base film; in this case, the base film can be omitted. $TiO_2$ may be formed as described in the above embodiment mode.

Subsequently, an irradiation region 203 is formed by irradiating $TiO_2$ in a desired region, in this embodiment mode, at opposite sides of a region where a wiring is to be formed with light having a photocatalytically activating wavelength. Then, the irradiation region shows an oil-repellent property.

A conductive film which functions as a gate electrode 211 is formed by dropping a dot including a conductive material mixed into a solvent from above a non-irradiation region to a non-irradiation region, using an ink-jet method.

Figure 6B:
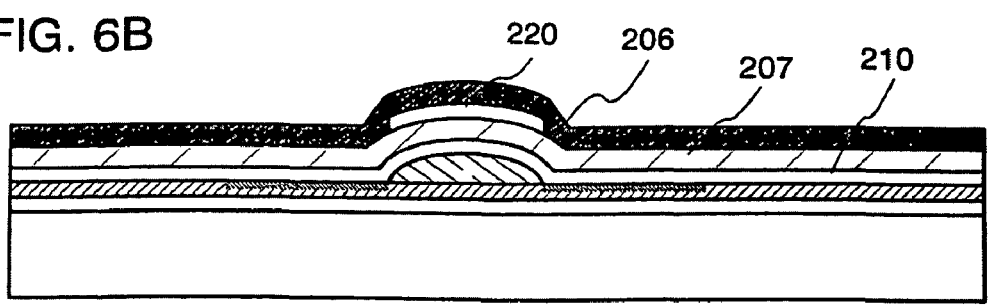

A gate insulating film 210 is formed to cover the gate electrode as shown in FIG. 6B. Thereafter, a semiconductor film 207 is formed by a plasma CVD method or the like. An insulating film is formed by, for example, a plasma CVD method, and is patterned to have a desired shape in a desired region in order to form a channel protective film 220. At this time, the channel protective film 220 can be formed by exposing a back of a substrate to light using the gate electrode as a mask. In addition, polyimide, polyvinyl alcohol, or the like may be dropped as the channel protective film by an ink-jet method. Consequently, the light-exposure step can be omitted.

Thereafter, a semiconductor film having one conductivity, for example, a semiconductor film having N-type conductivity 206 is formed by a plasma CVD method or the like.

Figure 6C:
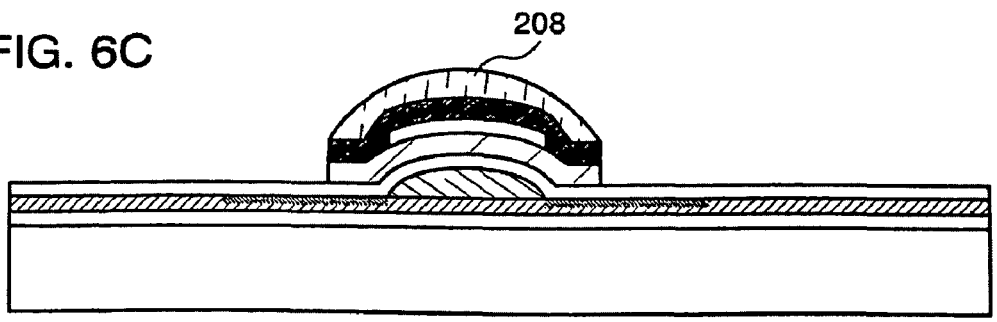

A mask 208 made of polyimide is formed by an ink-jet method over the N-type semiconductor film as shown in FIG. 6C. The semiconductor film 207 and the semiconductor film having N-type conductivity 206 are patterned by using the mask. Thereafter, washing is performed to remove the mask.

Figure 6D:
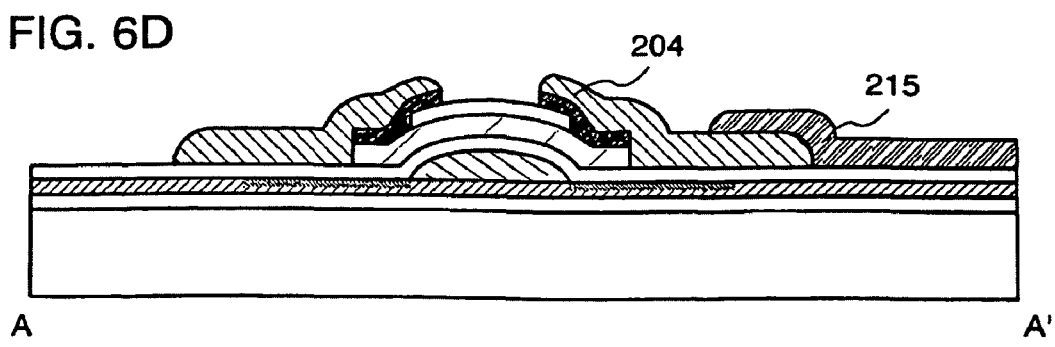

A wiring 204 is formed as shown in FIG. 6D. The wiring 204 can be formed by an ink-jet method. The wiring 204 functions as a so-called source electrode or drain electrode.

At this time, $TiO_2$ is formed in a region where the wiring 204 is to be formed and is irradiated with light having a photocatalytically activating wavelength to be hydrophilic, and the wiring may be formed by dropping a dot having a water-based solvent.

Alternatively, the wiring can be formed by forming $TiO_2$ at opposite ends where the wiring is to be formed, irradiating $TiO_2$ with light having a photocatalytically activating wavelength to be oil-repellent, and dropping a dot having an oil (alcohol) based solvent.

Then, an electrode 215 is formed to connect to the wiring 204. The electrode 215 can be formed by an ink-jet method.

The electrode 215 functions as a pixel electrode in a liquid crystal display device and functions as an anode or a cathode of a light emitting element in a light emitting device. A dot including a conductive material mixed into a water-based solvent can be used as the electrode 215. Specifically, a transparent conductive film can be formed by using a transparent conductive material. In addition, the gate insulating film is formed by using $TiO_2$, $TiO_2$ is formed on a desired top face of the gate insulating film, and a desired region where the electrode 215 is to be formed may be irradiated with light having a photocatalytically activating wavelength.

In addition, a dot including a conductive material dispersed in an oil (alcohol) based solvent may be dropped. In this case, opposite ends of the region where the electrode 215 is to be formed may be irradiated with light having a photocatalytically activating wavelength to be more oil-repellent.

In addition, the interlayer insulating film 213 may be formed, a contact hole may be formed in the interlayer insulating film, a wiring may be formed in the contact hole, and the wiring and the electrode 215 may be connected to each other, as described in the above embodiment mode. It is preferable to form the interlayer insulating film since planarity is enhanced.

Figure 7:
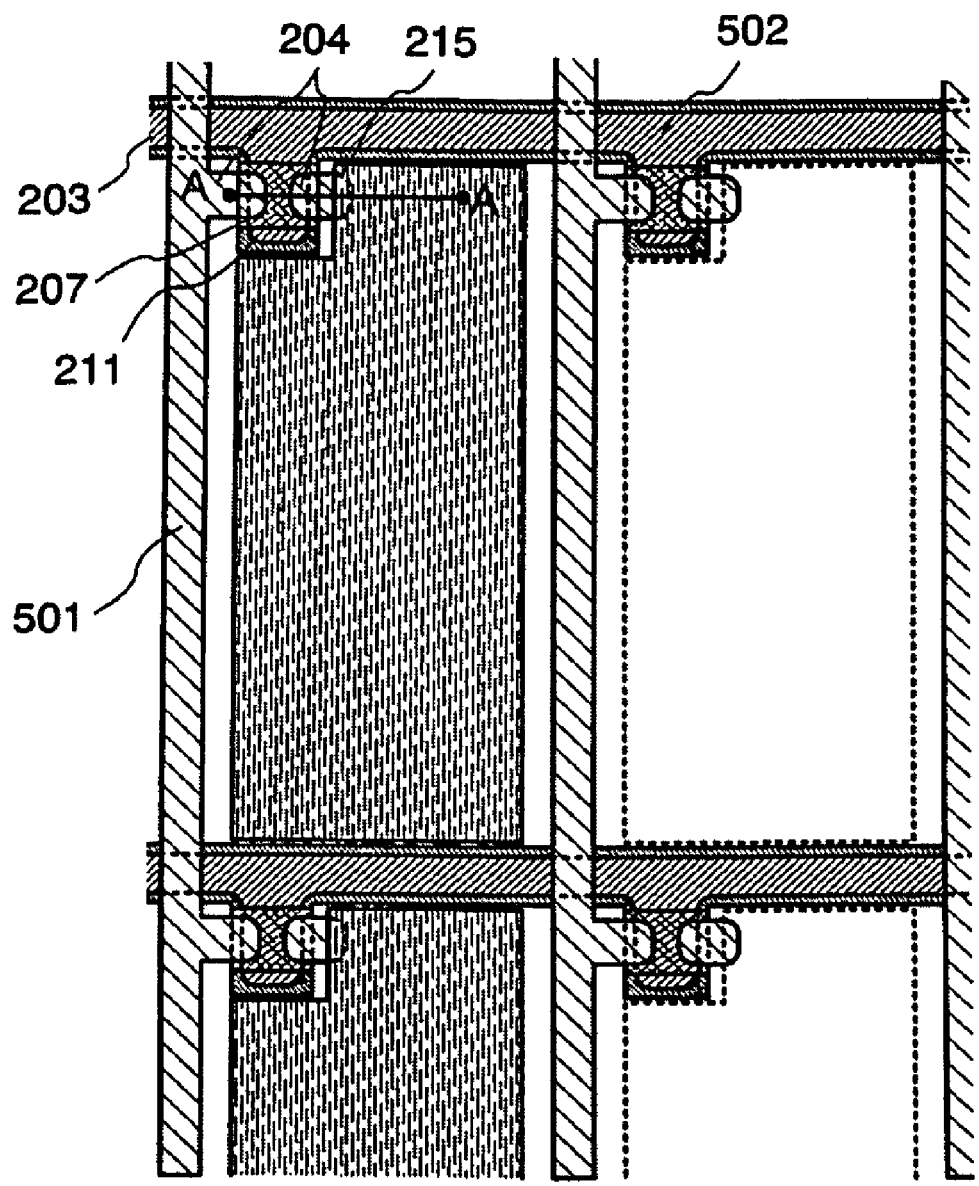
FIG. 7 is a top view showing a thin film transistor of the present invention.

FIG. 7 is a top view of a thin film transistor shown in FIGS. 6A to 6D. Note that FIG. 6D corresponds to a cross-sectional view taken along a line A-A' in FIG. 7.

The gate electrode 211 is formed on the same layer as a scanning line 502 by an ink-jet method. The irradiation region 203 where $TiO_2$ formed at opposite ends of a region where at least the gate electrode and the scanning line are to be formed is irradiated with light having a photocatalytically activating wavelength is formed, in order to make $TiO_2$ more oil-repellent.

Thereafter, the semiconductor film 207 or the like is formed over the gate electrode. A channel protective film is formed over the semiconductor film, and is irradiated with light from a back by using the gate electrode to perform light exposure as described above, although not shown. Then, the semiconductor film having N-type conductivity is formed, and the semiconductor film and the semiconductor film having N-type conductivity are patterned by using a mask formed by an ink-jet method.

The wiring 204 is formed over the semiconductor film having N-type conductivity, and the wiring is formed by an ink-jet method on the same layer as a signal line 501 to which a video signal or the like is inputted. At this time, the gate insulating film may be formed by using $TiO_2$, or $TiO_2$ is formed on a desired top face of the gate insulating film, and opposite ends of a region where a gate insulating film wiring and the signal line are to be formed may be irradiated with light having a photocatalytically activating wavelength to be more oil-repellent. At least opposite ends of a region where the signal line is to be formed is preferably irradiated with light having a photocatalytically activating wavelength. Accordingly, a position of a wiring to be formed can be controlled with accuracy.

Then, the electrode 215 is formed to connect to the wiring 204. The electrode 215 can be formed by an ink-jet method. In addition, the electrode 215 can be formed by dropping a dot having a water-based solvent or a dot having an oil (alcohol) based solvent. Specifically, a dot having a water-based solvent is dropped and a region thereof may be irradiated with light having a photocatalytically activating wavelength to be hydrophilic, in the case of making the electrode 215 thin. On the other hand, a dot having an oil (alcohol) based solvent is dropped and the periphery of a region thereof (referred to as opposite ends in the cross-sectional view) may be irradiated with light having a photocatalytically activating wavelength to be oil-repellent, in the case of making the electrode 215 thick. At this time, a film thickness of the electrode 215 can be controlled in accordance with the quantity of a dot to be dropped.

Thus, a thin film transistor having a narrower wiring, that is, a smaller wiring in width than a diameter of a dot can be formed by an ink-jet method utilizing a photocatalytic reaction. The thin film transistor of this embodiment mode is a so-called bottom gate thin film transistor in which a gate electrode is provided below a semiconductor film and a so-called channel protective thin film transistor in which a channel protective film is formed.

In addition, unnecessary $TiO_2$ may be removed in this embodiment mode. An unnecessary region means a region where a wiring is not formed; therefore, $TiO_2$ can be removed by dry etching or wet etching using a wiring as a mask.

Embodiment Mode 8

The case of forming a protective film to cover a thin film transistor by an ink-jet method is described in this embodiment mode.

Figure 8A:
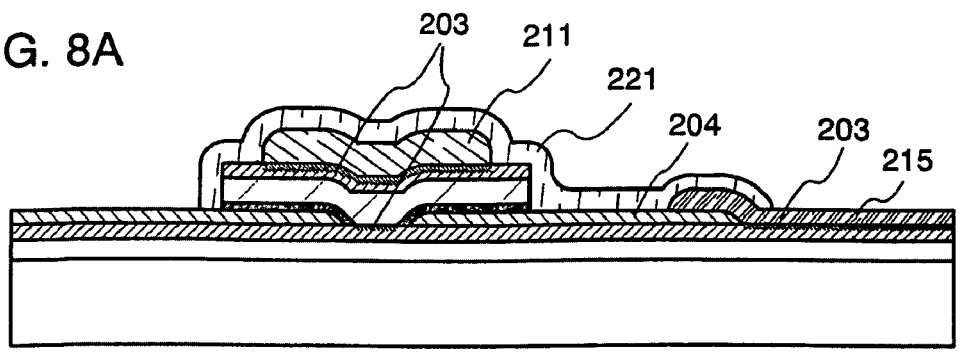
FIGS. 8A to 8C are cross-sectional views showing a step of manufacturing a thin film transistor of the present invention.

FIG. 8A shows a top gate thin film transistor, in which a wiring 204 and an electrode 215 are connected to each other without forming an interlayer insulating film. An irradiation region 203 with respect to $TiO_2$ is formed at opposite ends of a region where the wiring 204 is to be formed, and the wiring 204 is formed by dropping a dot having an oil (alcohol) based solvent. In addition, the irradiation region 203 may be formed also in a region where the electrode 215 is to be formed. In that case, the electrode 215 may be formed by dropping a dot having a water-based solvent.

Since an interlayer insulating film is not formed in the thin film transistor shown in FIG. 8A, the thin film transistor can be formed very thinly. In this state, a protective film 221 is formed to cover a gate electrode 211 and a part of the electrode 215. For example, polyimide, polyvinyl alcohol, or the like may be dropped by an ink-jet method. When such an interlayer insulating film is not formed, the thin film transistor can be protected from outside by forming a protective film.

Figure 8B:
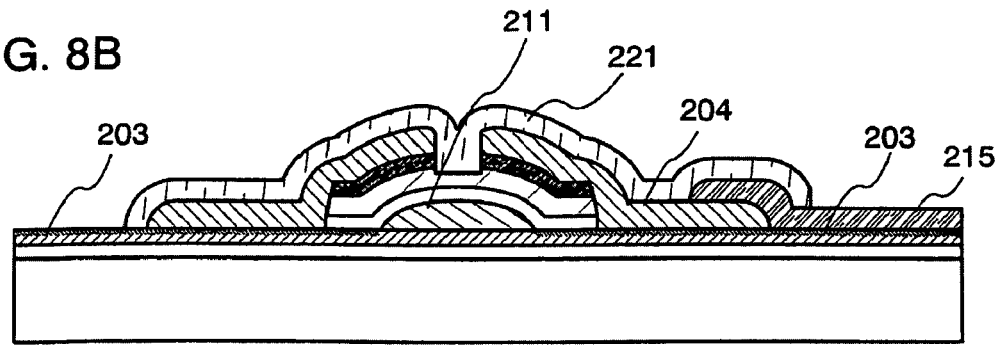

FIG. 8B shows a channel etch thin film transistor, in which a wiring 204 and an electrode 215 are connected to each other without forming an interlayer insulating film. An irradiation region 203 with respect to $TiO_2$ is formed at opposite ends of a region where a gate electrode 211 is to be formed, and the gate electrode 211 is formed by dropping a dot having an oil (alcohol) based solvent. In addition, the irradiation region 203 may be formed also in a region where the electrode 215 is to be formed. In that case, the electrode 215 may be formed by dropping a dot having a water-based solvent.

Since an interlayer insulating film is not formed in the thin film transistor shown in FIG. 8B, the thin film transistor can be formed very thinly. In this state, a protective film 221 is formed to cover the wiring 204 and a part of the electrode 215. For example, polyimide or the like may be dropped by an ink-jet method. When such an interlayer insulating film is not formed, the thin film transistor can be protected from outside by forming a protective film. Note that the protective film may be formed to cover at least an etched channel formation region.

Figure 8C:
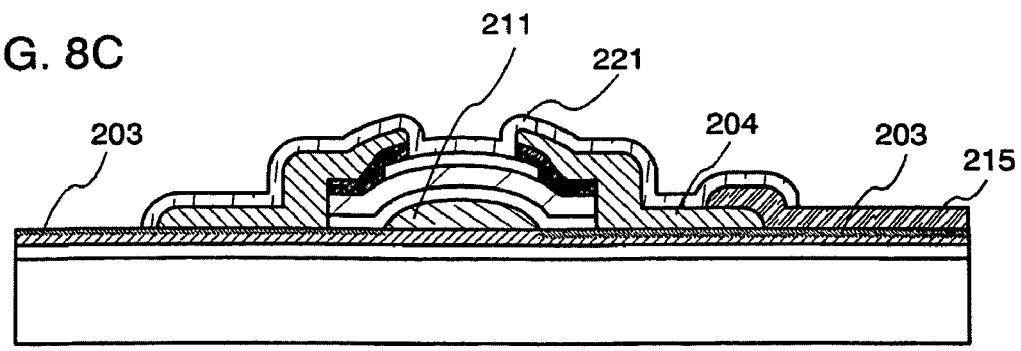

FIG. 8C shows a channel protective thin film transistor, in which a wiring 204 and an electrode 215 are connected to each other without forming an interlayer insulating film. An irradiation region 203 with respect to $TiO_2$ is formed at opposite ends of a region where a gate electrode 211 is to be formed, and the gate electrode 211 is formed by dropping a dot having an oil (alcohol) based solvent. In addition, the irradiation region 203 may be formed also in a region where the electrode 215 is to be formed. In that case, the electrode 215 may be formed by dropping a dot having a water-based solvent.

Since an interlayer insulating film is not formed in the thin film transistor shown in FIG. 8C, the thin film transistor can be formed very thinly. In this state, a protective film 221 is formed to cover the wiring 204 and a part of the electrode 215. For example, polyimide or the like may be dropped by an ink-jet method. When such an interlayer insulating film is not formed, the thin film transistor can be protected from outside by forming a protective film.

The thin film transistor can be protected from outside by forming a protective film with an ink-jet method in this way. Further, it is preferable to form a protective film by an ink-jet method since a light-exposure step of a photomask, an etching step using the mask, and a removal step of the mask can be omitted.

Embodiment Mode 9

A light emitting device having a thin film transistor described in the above embodiment mode is described in this embodiment mode.

Figure 9A:
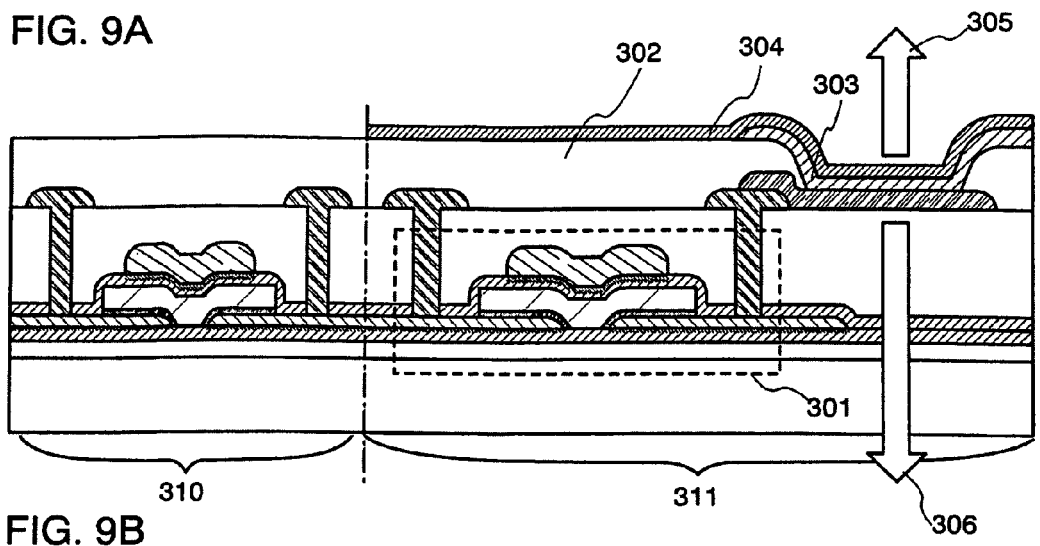
FIGS. 9A to 9C are cross-sectional views showing a step of manufacturing a thin film transistor of the present invention.

As shown in FIG. 9A, a top gate N-channel type TFT is formed in a driver circuit portion 310 and a pixel portion 311 based on the above embodiment mode. Specifically, an N-channel type TFT connected to a light emitting element formed in the pixel portion 311 is referred to as a driving TFT 301. An insulating film 302 referred to as a bank or a partition wall is formed to cover an edge portion of an electrode (referred to as a first electrode) 215 included in the driving TFT 301. An inorganic material (silicon oxide, silicon nitride, silicon oxynitride, or the like), a photosensitive or non-photosensitive organic material (polyimide, acrylic, polyamide, polyimidamide, a resist, or benzocyclobutene), a material in which a skeletal structure is configured by a bond of silicon (Si) and oxygen (O) and which contains at least hydrogen as a substituent, or which contains at least one kind of fluorine, an alkyl group, and aromatic hydrocarbon as a substituent, that is, so-called siloxane, or a laminated structure thereof can be used as the insulating film 302. A positive photosensitive organic resin or a negative photosensitive organic resin can be used as the organic material.

An opening is formed in the insulating film 302 over the first electrode 215. The opening is provided with an electroluminescent layer 303, and a second electrode 304 of a light emitting element is provided to cover the electroluminescent layer and the insulating film 302.

Note that a singlet excited state and a triplet excited state can be given as the kind of a molecular exciton generated in the electroluminescent layer. A ground state is normally a singlet state; therefore, luminescence from a siglet excited state is referred to as fluorescence and luminescence from a triplet excited state is referred to as phosphorescence. Luminescence from the electroluminescent layer includes the case where either excited state contributes. In addition, fluorescence and phosphorescence can be combined and used, and can be selected in accordance with a luminescence property (such as light-emitting luminance or life) of each RGB.

The electroluminescent layer 303 is formed by sequentially laminating an HIL (hole injection layer), an HTL (hole transport layer), an EML (emission layer), an ETL (electron transport layer), and an EIL (electron injection layer) in this order from a side of the first electrode 215. Note that the electroluminescent layer can have a single layer structure or a combined structure as well as a laminated structure.

In the case of full color display, a material showing light of red (R), green (G), and blue (B) may be selectively formed as the electroluminescent layer 303 by an evaporation method using an evaporation mask for each, an ink-jet method, or the like. It is preferable to form it by an ink-jet method since RGB can be separately colored without using a mask. Obviously, a monochrome electroluminescent layer may be formed by an ink-jet method.

Specifically, CuPc or PEDOT is used as the HIL; α-NPD, as the HTL; BCP or $Alq_3$, as the ETL; BCP:Li or $CaF_2$, as the EIL respectively. In addition, $Alq_3$ doped with a dopant in accordance with the respective colors of R, G, and B (DCM or the like in the case of R, and DMQD or the like in the case of G) may be used as the EML, for example. Note that the electroluminescent layer is not limited to a material having the above laminated structure. For example, a hole injection property can be enhanced by co-evaporating oxide such as molybdenum oxide (MoOx: x=2 to 3) and α-NPD or rubrene. An organic material (including a low molecular weight material or a high molecular weight material) or a composite material of an organic material and an inorganic material can be used as the material.

In the case of forming an electroluminescent layer of each RGB, high-definition display can be performed by using a color filter.

In the case of forming an electroluminescent layer showing white light-emission, full color display can be performed by separately providing a color filter, a color filter and a color conversion layer, or the like. The color filter or the color conversion layer may be formed over a second substrate (sealing substrate) for example, and then, attached. The color filter or the color conversion layer can be formed by an ink-jet method. Obviously, monochrome light emitting device may be formed by forming an electroluminescent layer which shows light-emission except white. In addition, an area color type display device which can perform monochrome display may be formed. A passive matrix display portion is suitable for the area color type and can mainly display characters and symbols.

In addition, it is necessary to select materials of the first electrode 215 and the second electrode 304 in consideration of a work function. However, both the first electrode and the second electrode can be an anode or a cathode depending on a pixel structure. Since polarity of the driving TFT is an N-channel type, the first electrode is preferably a cathode and the second electrode is preferably an anode in this embodiment mode. When polarity of the driving TFT is a P-channel type, the first electrode is preferably an anode and the second electrode is preferably a cathode.

Hereinafter, an electrode material used for an anode and a cathode is described.

It is preferable to use a metal, an alloy, a conductive compound, a mixture thereof, or the like having a high work function (work function: 4.0 eV) as an electrode material used for the anode. ITO (indium tin oxide), IZO (indium zinc oxide) in which zinc oxide (ZnO) of from 2% to 20% is mixed into indium oxide, ITSO in which silicon oxide ($SiO_2$) of from 2% to 20% is mixed into indium oxide, gold (Au), platinum (Pt), nickel (Ni), tungsten (W), chromium (Cr), molybdenum (Mo), iron (Fe), cobalt (Co), copper (Cu), palladium (Pd), nitride (TiN) of a metal material, or the like can be used as a specific material.

On the other hand, it is preferable to use a metal, an alloy, a conductive compound, a mixture thereof, or the like having a low work function (work function: equal to or less than 3.8 eV) as an electrode material used for the cathode. An element belonging to Group 1 or 2 in the periodic table, that is, alkaline metal such as Li or Cs, alkaline earth metal such as Mg, Ca, or Sr, an alloy (Mg:Ag or Al:Li) or a compound (LiF, CsF, or $CaF_2$) including them, or a transition metal including a rare-earth metal can be used as a specific material. However, the second electrode can be formed by very thinly forming the metal or an alloy including the metal and by laminating ITO, IZO, ITSO, or another metal (including an alloy) thereover, since the second electrode is not light transmitting in this embodiment mode.

The first electrode and the second electrode can be formed by an evaporation method, a sputtering method, an ink-jet method, or the like.

In the case of forming a conductive film, ITO or ITSO, or a lamination body thereof as the second electrode by a sputtering method, the electroluminescent layer may be damaged. In order to reduce damage due to a sputtering method, oxide such as molybdenum oxide (MoOx: x=2 to 3) is preferably formed on a top surface of the electroluminescent layer. Therefore, oxide such as molybdenum oxide (MoOx: x=2 to 3) which functions as the HIL or the like is formed on a top face of the electroluminescent layer. An EIL (electron injection layer), an ETL (electron transport layer), an EML (emission layer), an HTL (hole transport layer), an HIL (hole injection layer), and the second electrode may be laminated in this order from a side of the first electrode. At this time, the first electrode functions as a cathode and the second electrode functions as an anode.

Since polarity of the driving TFT is an N-channel type in this embodiment mode, the first electrode is preferably a cathode, and the EIL (electron injection layer), the ETL (electron transport layer), the EML (emission layer), the HTL (hole transport layer), the HIL (hole injection layer), and the second electrode are preferably an anode in consideration of a moving direction of an electron.

Thereafter, a passivation film containing nitrogen, a DLC, or the like is preferably formed by a sputtering method or a CVD method. Accordingly, penetration of moisture and oxygen can be prevented. In addition, penetration of oxygen or moisture can be prevented by covering a side of a display means with the first electrode, the second electrode, or another electrode. Subsequently, a sealing substrate is attached. A space formed by the sealing substrate may be encapsulated with nitrogen or may be provided with a drying agent. In addition, a light transmitting and high absorbent resin may be filled.

In addition, a polarizing plate or a circular polarizing plate may be provided to increase contrast. For example, one side of or both sides of a display surface can be provided with a polarizing plate or a circular polarizing plate.

The first electrode and the second electrode are light transmitting in the light emitting device having a thus formed structure. Therefore, light is emitted in both arrow directions 305 and 306 from the electroluminescent layer with luminance in accordance with a video signal inputted from a signal line.

Figure 9B:
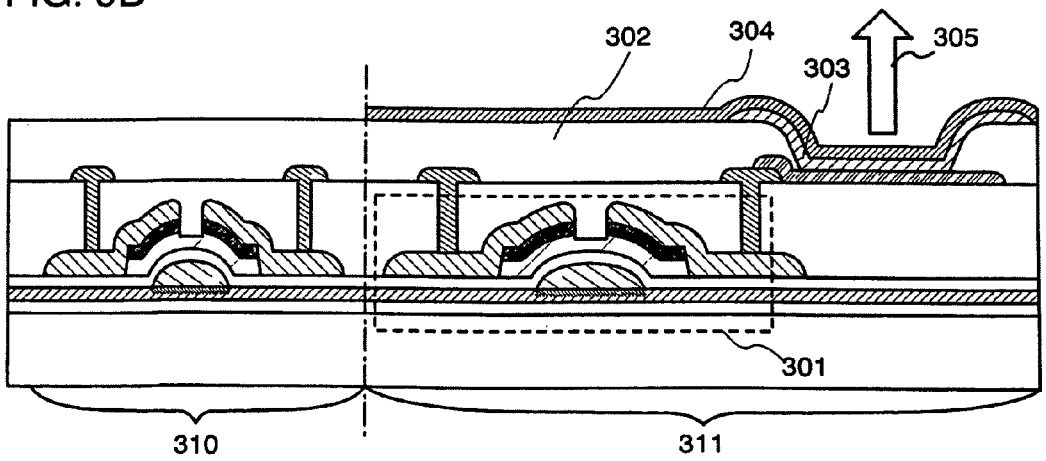

A structure of a light emitting device shown in FIG. 9B is based on the above embodiment mode, and a channel etch N-channel type TFT is formed in the driver circuit portion 310 and the pixel portion 311. As described in FIG. 9A, an N channel TFT connected to a light emitting element formed in the pixel portion 311 is referred to as the driving TFT 301. The light emitting device is different from that in FIG. 9A in the way that the first electrode 215 is a non-light-transmitting, preferably, highly reflective conductive film and the second electrode 304 is a light transmitting conductive film. Therefore, a light emitting direction is only on a sealing substrate side.

In the case of using a light transmitting conductive film formed by a sputtering method as the second electrode in FIG. 9B, the electroluminescent layer may be damaged as described above. In order to reduce damage due to a sputtering method, oxide such as molybdenum oxide (MoOx: x=2 to 3) is preferably formed on a top surface of the electroluminescent layer. Therefore, oxide such as molybdenum oxide (MoOx: x=2 to 3) which functions as an HIL or the like is formed on a top surface of the electroluminescent layer, and an EIL (electron injection layer), an ETL (electron transport layer), an EML (emission layer), an HTL (hole transport layer), an HIL (hole injection layer), and the second electrode may be sequentially laminated in this order from a side of the first electrode. Since polarity of the driving TFT is an N-channel type specifically in this embodiment mode, the first electrode is preferably a cathode, and the EIL (electron injection layer), the ETL (electron transport layer), the EML (emission layer), the HTL (hole transport layer), the HIL (hole injection layer), and the second electrode are preferably an anode. Since other structures are similar to that in FIG. 9A, description is omitted.

Figure 9C:
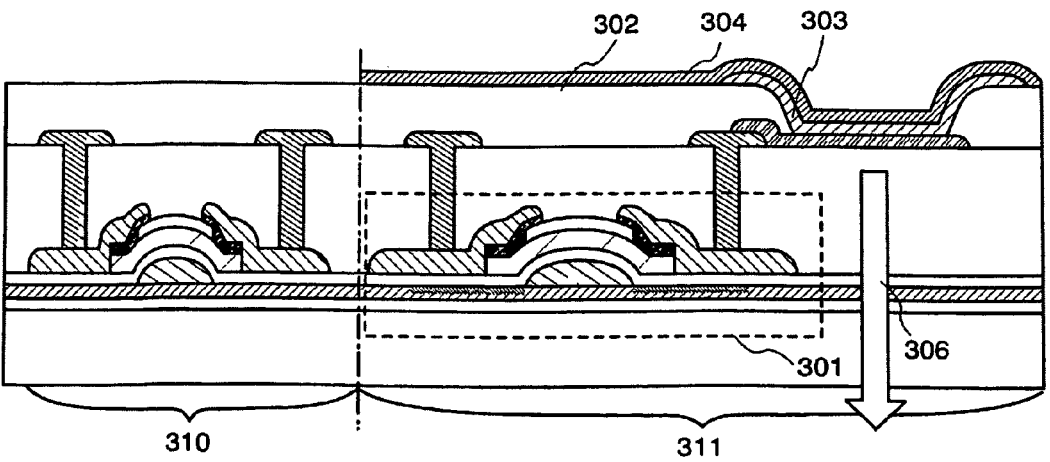

A structure of a light emitting device shown in FIG. 9C is based on the above embodiment mode, and a channel protective N-channel type TFT is formed in the driver circuit portion 310 and the pixel portion 311. As in FIG. 9A, an N-channel type TFT connected to a light emitting element formed in the pixel portion 311 is referred to as the driving TFT 301. The light emitting device is different from that in FIG. 9A in the way that the first electrode 215 is a light transmitting conductive film and the second electrode 304 is a non-light-transmitting, preferably, highly reflective conductive film. Therefore, a light emitting direction 306 is only on a sealing substrate side.

In the case of using a non-light-transmitting conductive film formed by a sputtering method as the second electrode in FIG. 9C, the electroluminescent layer may be damaged as described above. In order to reduce damage due to a sputtering method, oxide such as molybdenum oxide (MoOx: x=2 to 3) is preferably formed on a top surface of the electroluminescent layer. Therefore, oxide such as molybdenum oxide (MoOx: x=2 to 3) which functions as an HIL or the like is formed on a top surface of the electroluminescent layer, and an EIL (electron injection layer), an ETL (electron transport layer), an EML (emission layer), an HTL (hole transport layer), an HIL (hole injection layer), and the second electrode may be sequentially laminated in this order from a side of the first electrode. Since polarity of the driving TFT is an N-channel type specifically in this embodiment mode, the first electrode is preferably a cathode, and the EIL (electron injection layer), the ETL (electron transport layer), the EML (emission layer), the HTL (hole transport layer), the HIL (hole injection layer), and the second electrode are preferably an anode. Since other structures are similar to that in FIG. 9A, description is omitted.

Light can be efficiently utilized by using a highly reflective conductive film as a non-light-transmitting electrode provided on a side which does not become a light emitting direction as in FIGS. 9B and 9C.

In this embodiment mode, a non-light-transmitting conductive film is thinly formed to be light transmitting in order to obtain a light transmitting conductive film, and a light-transmitting conductive film may be laminated thereover.

Hereinbefore, a structure of a light emitting device is described using each thin film transistor; however, a structure of a thin film transistor and a structure of a light emitting device may be combined anyhow.

Note that digital gradation display and analog gradation display can be performed in a light emitting device; however, analog gradation display is preferably performed in a light emitting device using an amorphous semiconductor film.

Embodiment Mode 10

A light emitting device different from a light emitting device having a thin film transistor described in the above embodiment mode is described in this embodiment mode. Specifically, an insulating film 302 referred to as a bank or a partition wall is formed to cover the electrode 215 without forming an interlayer insulating film.

Figure 10A:
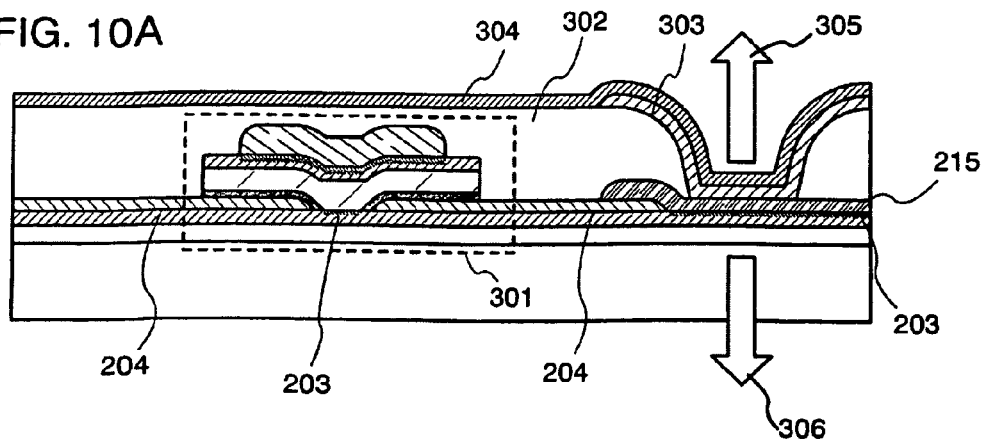
FIGS. 10A to 10C are cross-sectional views showing a step of manufacturing a thin film transistor of the present invention.
Figure 10B:
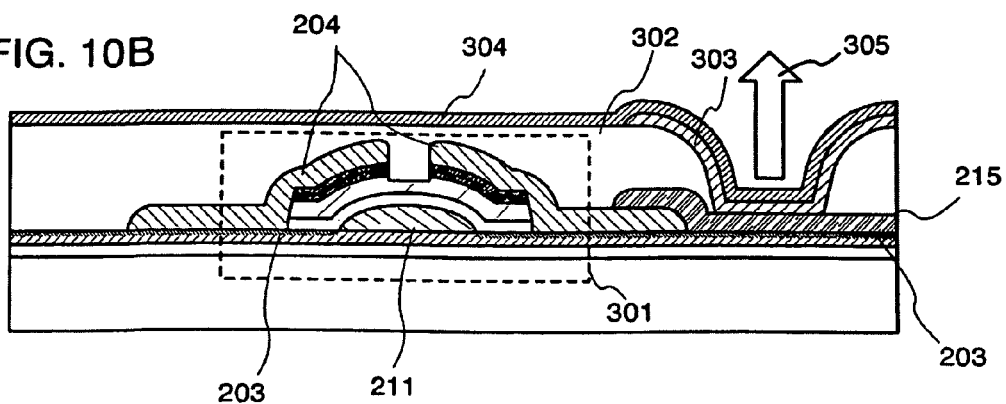
Figure 10C:
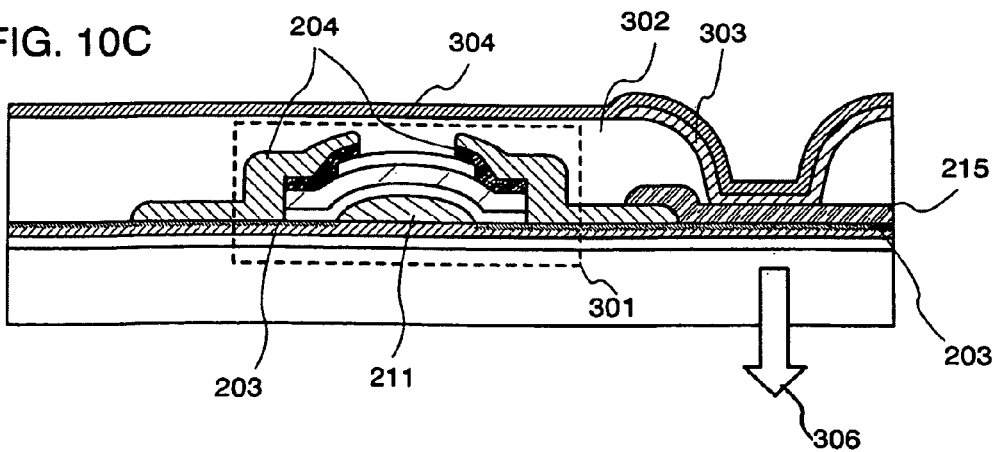

In a light emitting device shown in FIGS. 10A to 10C, a top gate N-channel type TFT (referred to as a driving TFT 301) is formed in the pixel is portion, based on the above embodiment mode. An electrode (referred to as a first electrode) 215 connected to the driving TFT 301 is formed. At this time, an irradiation region 203 or a gate electrode 211 is oil-repellent, and a dot including a conductive material mixed into an oil (alcohol) based solvent is used as a dot for forming the wiring 204. Then, a dot including a conductive material mixed into a water-based solvent may be used as a dot for forming the electrode 215. In other words, a photocatalytic substance can be at once hydrophilic and oil-repellent when light irradiation is continued. In this way, a solvent of a dot to be a wiring material can be separately used in accordance with a photocatalyst substance.

Thereafter, the insulating film 302 referred to as a bank or a partition wall is formed to cover the electrode 215, and an opening is formed in the insulating film 302 over the electrode 215.

At this time, the insulating film 302 is formed without forming an interlayer insulating film; therefore, a very thin lightweight light emitting device can be formed. In addition, the insulating film 302 has a function as a protective film 221 described in the above embodiment mode; therefore, a step of forming a protective film of polyimide, polyvinyl alcohol, or the like can be reduced.

An opening is formed in the insulating film 302 over the first electrode 215. The opening is proved with an electroluminescent layer 303, and a second electrode 304 of a light emitting element is provided to cover the electroluminescent layer and the insulating film 302.

Steps thereafter are similar to those shown in FIGS. 9A to 9C described in the above embodiment mode; therefore, description is omitted.

As described above, this embodiment mode can form a very thin lightweight light emitting device.

Embodiment Mode 11

An equivalent circuit diagram and a top view of a light emitting device including a thin film transistor having an amorphous semiconductor film described in the above embodiment mode are described in this embodiment mode. Although a TFT has three terminals, that is, a gate, a source, and a drain, a source terminal (source electrode) and a drain terminal (drain electrode) cannot be clearly distinguished because of a transistor structure. Therefore, one of a source electrode and a drain electrode is referred to as a first electrode, and the other is referred to as a second electrode, when connection between terminals is described.

Figure 20A:
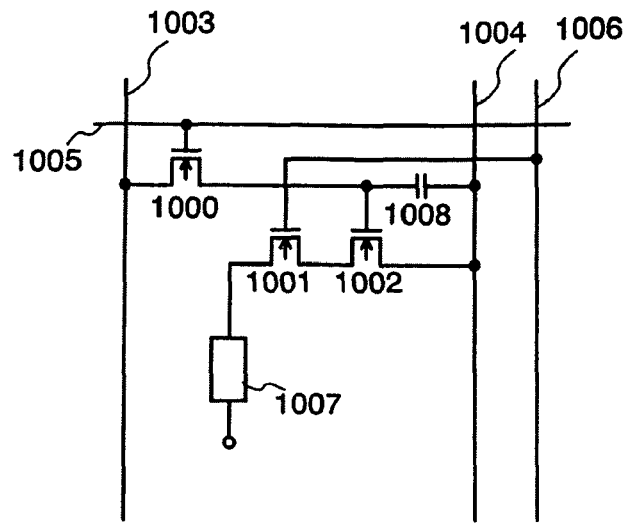
FIGS. 20A and 20B are top views showing a thin film transistor of the present invention.

FIG. 20A shows an equivalent circuit diagram of a pixel portion of a light emitting device. One pixel includes a TFT for switching (switching TFT) 1000, a TFT for driving (driving TFT), and a TFT for controlling current (current controlling TFT) 1002, and these TFTs are N-channel types. One electrode and a gate electrode of the switching TFT 1000 are connected to a signal line 1003 and a scanning line 1005, respectively. One electrode of the current controlling TFT 1002 is connected to a first power supply line 1004, and a gate electrode is connected to the other electrode of the switching TFT.

A capacitor element 1008 may be provided to hold gate-source voltage of the current controlling TFT. In this embodiment mode, when electric potential of the first power supply line is low and that of a light emitting element is high, the current controlling TFT is an N-channel type. Therefore, the source electrode and the first power supply line are connected. Therefore, the capacitor element can be provided between the gate electrode and a source electrode of the current controlling TFT, that is, the first power supply line. When the switching TFT, the driving TFT, or the current controlling TFT has a large gate capacity and leak current from each TFT is tolerance, the capacitor element 1008 does not need to be provided.

One electrode of the driving TFT 1001 is connected to the other electrode of the current controlling TFT, and the gate electrode is connected to a second power supply line 1006. The second power supply line 1006 has fixed electric potential. Therefore, gate electric potential of the driving TFT can be fixed electric potential, and the driving TFT can be operated so that gate-source voltage Vgs by parasitic capacitance or wiring capacitance does not change.

Then, a light emitting element 1007 is connected to the other electrode of the driving TFT. In this embodiment mode, when electric potential of the first power supply line is low and that of the light emitting element is high, a cathode of the light emitting element is connected to a drain electrode of the driving ITT. Therefore, it is preferable to sequentially laminate a cathode, an electroluminescent layer, and an anode as described above. At this time, in order to reduce damage due to a sputtering method during forming the second electrode, oxide such as molybdenum oxide (MoOx: x=2 to 3) is preferably formed on a top surface of the electroluminescent layer. Therefore, it is more preferable to form oxide such as molybdenum oxide (MoOx: x=2 to 3) which functions as an HIL or the like on a top surface of the electroluminescent layer. In this way, it is preferable to connect the drain electrode and the cathode of the TFT and to laminate an EIL, an ETL, an EML, an HTL, an HIL, and an anode in this order, in the case of a TFT having an amorphous semiconductor film and an N-channel type.

Hereinafter, operation of such a pixel circuit is described.

When the scanning line 1005 is selected and the switching TFT is turned ON, a charge begins to be stored in the capacitor element 1008. The charge in the capacitor element 1008 is stored until it becomes equal to gate-source voltage of the current controlling TFT. When it gets equal, the current controlling TFT is turned ON, and then, a serially connected driving TFT is turned ON. At this time, gate potential of the driving TFT is fixed potential. Therefore, constant gate-source voltage Vgs which does not depend on the parasitic capacitance or the wiring capacitance can be applied to the light emitting element. Namely, current for the constant gate-source voltage Vgs can be supplied.

Since the light emitting element is a current driving type element, it is preferable to employ analog driving in the case of having few characteristic variation of the TFT in the pixel, specifically, Vth variation, As in this embodiment mode, a TFT having an amorphous semiconductor film has few characteristics variation; therefore, analog driving can be employed. On the other hand, a constant current value can be supplied to the light emitting element even with digital driving by operating the driving TFT in a saturation region (region satisfying |Vgs−Vth|<|Vds|).

Figure 20B:
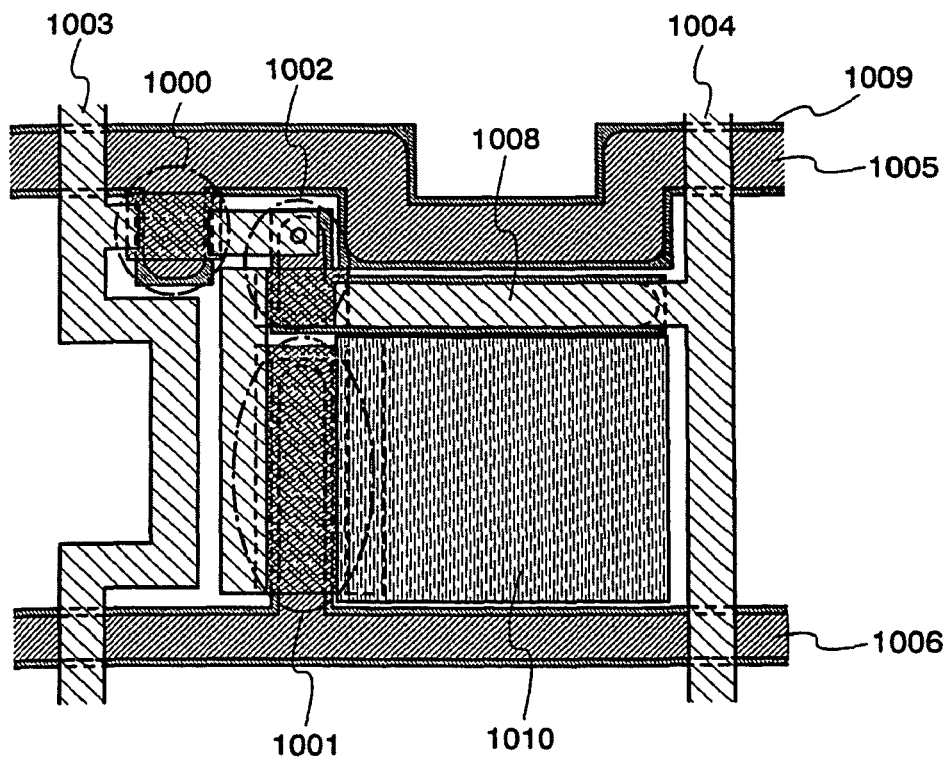

FIG. 20B shows an example of a top view of a light emitting device having the above equivalent circuit.

First, a gate electrode, a scanning line, and a second power supply line of each TFT are formed on the same layer by an ink-Jet method. An irradiation region 1009 which is irradiated with light having a photocatalytically activating wavelength is formed within $TiO_2$ formed at opposite ends of a region where at least the gate electrode and the scanning line are to be formed, in order to make the irradiation region 1009 more oil-repellent.

Then, a semiconductor film of each TFT is formed. The semiconductor film is entirely formed by a plasma CVD method to be a semiconductor film of each TFT by using a mask, in this embodiment mode. Although not shown, a gate insulating film is subsequently formed.

Then, a source electrode, a drain electrode, a signal line, and a first power supply line are formed on the same layer. The source electrode, the drain electrode, the signal line, and the first power supply line can be formed by an ink-jet method, a plasma CVD method, or the like.

A contact hole is formed in the gate insulating film to connect one wiring of the switching TFT to the gate electrode of the current controlling TFT.

In this embodiment mode, the capacitor element 1008 is made up of a gate wiring and a source-drain wiring which are disposed with the gate insulating film therebetween.

An electrode 1010 of the light emitting element 1007 is formed to connect to one electrode of the driving TFT.

Since the driving TFT has an amorphous semiconductor film, it is designed to have a wide channel width (W).

In this way, a pixel portion of a light emitting device can be formed.

In this embodiment mode, an active matrix light emitting device where one pixel is provided with each TFT is described; however, a passive matrix light emitting device where a TFT is provided every line can be formed. The passive matrix light emitting device has a high aperture ratio since each pixel is not provided with the TFT. Therefore, the passive matrix display device is preferably used in the case of a light emitting device which emits light to both sides of the electroluminescent layer. When pixel density is increased, the active matrix light emitting device is considered to have an advantage over low voltage driving since each pixel is provided with the TFT.

Such a thin film transistor having a narrower wiring, that is, a smaller wiring in width than a diameter of a dot can be formed by an ink-jet method utilizing a photocatalytic reaction.

In addition, unnecessary $TiO_2$ may be removed in this embodiment mode. An unnecessary region means a region where a wiring is not formed; therefore, $TiO_2$ can be removed by dry etching or wet etching using a wiring as a mask.

Embodiment Mode 12

A structure of a top gate thin film transistor in which a semiconductor film having one conductivity is formed without a plasma CVD method is described in this embodiment mode.

Figure 11A:
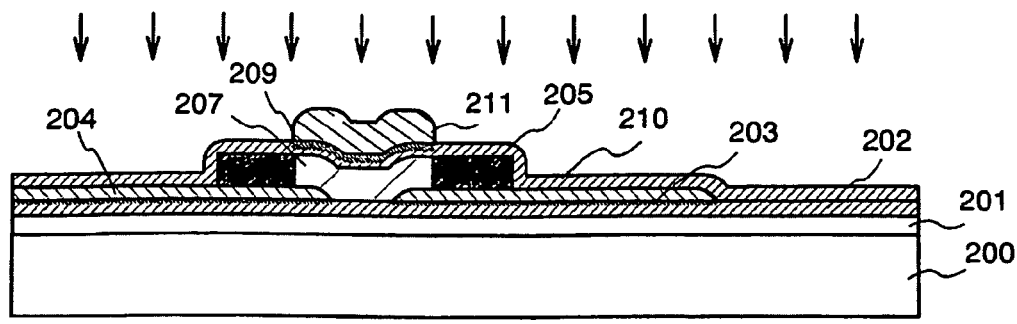
FIGS. 11A to 11C are cross-sectional views showing a step of manufacturing a thin film transistor of the present invention.

A base film 201, a photocatalytic substance 202, an irradiation region 203, a wiring 204 formed by an ink-jet method, a semiconductor film 207, a gate insulating film 210 made of $TiO_2$, an irradiation region 209 within the gate insulating film, and a gate electrode 211 formed by an ink-jet method are formed over a substrate 200 having an insulating surface as described in the above embodiment mode and as shown in FIG. 11A. In order to form the wiring 204 and the gate electrode 211 in the irradiation regions 203 and 209 respectively by an ink-jet method, a water-based solvent is used as a solvent thereof. Note that they may be formed by using a dot having an oil (alcohol) based solvent; in that case, an irradiation region may be formed at opposite ends of a region where the wiring or the gate electrode is to be formed.

Thereafter, instead of forming a semiconductor film having one conductivity, for example, a semiconductor film having N-type conductivity, an impurity element having N-type conductivity, for example, phosphorus (P) is added using the gate electrode as a mask. Accordingly, a connection resistance between the semiconductor film and the wiring (corresponding to a source electrode and a drain electrode) 204 can be decreased. In addition, steps can be reduced since it becomes unnecessary to pattern the semiconductor film having N-type conductivity formed between the wirings 204.

Figure 11B:
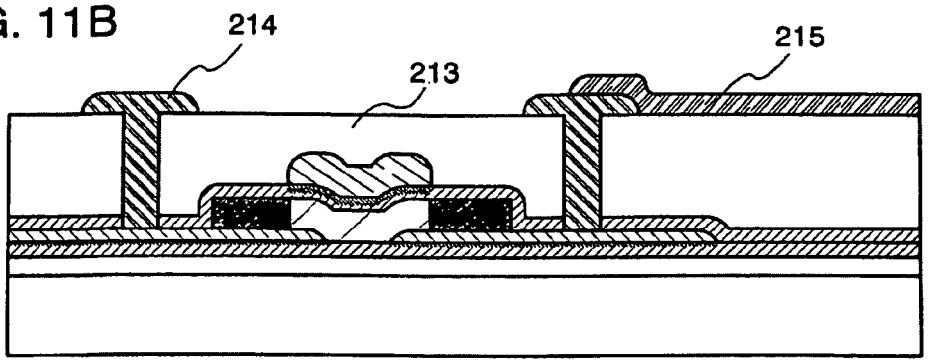

An interlayer insulating film 213 is formed to cover the gate electrode 211 as shown in FIG. 11B. A contact hole is formed in the interlayer insulating film 213 formed over the wiring 204. A wiring 214 is formed in the contact hole, and an electrode 215 is formed to connect to the wiring 214. The electrode 215 can be formed by an ink-jet method.

Figure 11C:
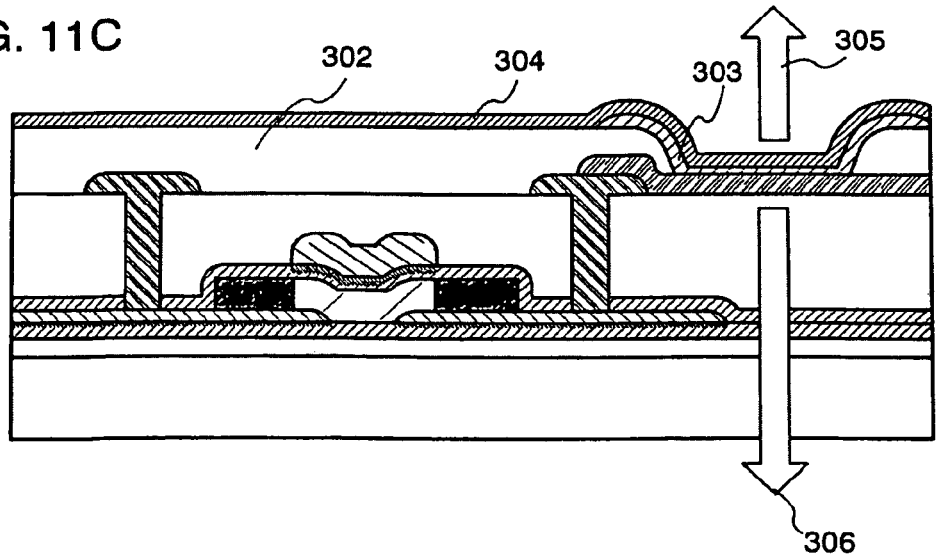

An insulating film 302 referred to as a bank or a partition wall is formed to cover the electrode 215, and an opening is formed in the insulating film 302 over the electrode 215, as shown in FIG. 11C. Since a material of the insulating film is similar to that in the above embodiment mode, description is omitted. An electroluminescent layer 303 is formed in the opening to be in contact with the electrode 215. Then, a second electrode 304 is formed to cover the electroluminescent layer. Since a structure of the electroluminescent layer is similar to that in the above embodiment mode, description is omitted. Since structures of the first electrode 215 and the second electrode 304 are similar to those in the above embodiment mode, description is omitted.

Connection resistance between the semiconductor film and the source wiring and the drain wiring can be decreased by adding an impurity element instead of forming a semiconductor film having N-type conductivity as described above. Further, a step of patterning the semiconductor film having N-type conductivity can be omitted.

Embodiment Mode 13

A thin film transistor using a crystalline semiconductor film is described in this embodiment mode.

Figure 12A:
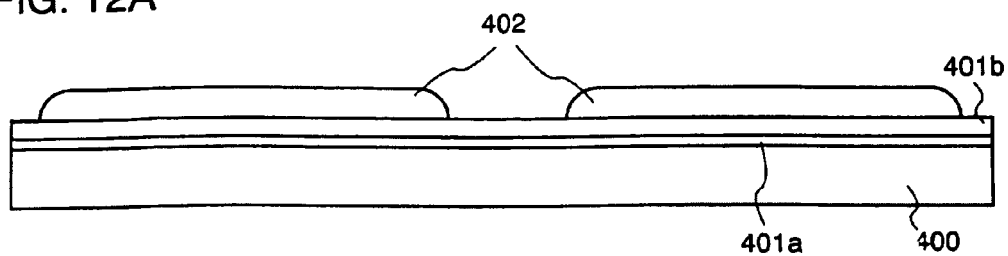
FIGS. 12A to 12D are cross-sectional views showing a step of manufacturing a thin film transistor of the present invention.

A base film 401 is formed over a substrate 400 having an insulating surface as shown in FIG. 12A. The base film 401 may have a laminated structure. In this embodiment mode, a silicon oxynitride film formed as a first base film 401a to be from 10 nm to 200 nm (preferably, from 50 nm to 200 nm) in thickness by a plasma CVD method with $SiH_4$, $N_2O$, $NH_3$, or $N_2$ used as a material gas, pressure of 0.3 Torr (39.9 Pa), RF power of 50 W, an RF frequency of 60 MHz, and a substrate temperature of 400° C., and a silicon oxynitride film formed as a second base film 401b to be from 50 nm to 200 nm (preferably, from 150 nm to 200 nm) in thickness by a plasma CVD method with $SiH_4$ or $N_2O$ used as a material gas, pressure of 0.3 Torr (39.9 Pa), RF power of 150 W, an RF frequency of 60 MHz, and a substrate temperature of 400° C. are sequentially laminated.

An amorphous semiconductor film is formed over the base film 401. A film thickness of the amorphous semiconductor film is from 25 nm to 100 nm (preferably, from 30 nm to 60 nm). In addition, silicon germanium as well as silicon can be used for the amorphous semiconductor. In the case of using silicon germanium, a concentration of germanium is preferably set about from 0.01 atomic % to 4.5 atomic %. In this embodiment mode, a semiconductor film containing silicon as its main component (also referred to as an amorphous silicon film) having a thickness of 66 nm is used.

Subsequently, the amorphous semiconductor film is crystallized to form a crystalline semiconductor film. As a crystallizing means, a metal element which promotes crystallization can be added and be heated. It is preferable to form a metal element since crystallization can be performed at low temperature. However, a step of removing the metal element is required. One of or a plurality of Ni, Fe, Co, Pd, Pt, Cu, Au, Ag, In, and Sn can be used as the metal element.

In addition, the amorphous semiconductor film may be irradiated with laser light. A continuous wave laser (CW laser) or a pulsed oscillation laser (pulsed laser) can be used. One of or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used as the laser.

For example, a Ni solution (including an aqueous solution and an acetic acid solution) is applied onto the amorphous semiconductor film by an application method such as a spin coating method or a dip method. At this time, in order to improve wettability of the surface of the amorphous semiconductor film and to coat all over the surface thereof with the solution, it is desirable to form an oxide film to be from 1 nm to 5 nm by UV light radiation in the oxygen atmosphere, by a thermal oxidation method, by treatment using ozone water or hydrogen peroxide including a hydroxyl radical, or the like. Alternatively, a Ni ion can be injected to the amorphous semiconductor film by an ion implantation method; heat treatment can be performed in the water vapor atmosphere including Ni; or the sputtering can be performed using a Ni material as a target under Ar plasma. In this embodiment mode, an aqueous solution containing Ni acetate by 10 ppm is applied by a spin coating method.

Thereafter, the amorphous semiconductor is heated at a temperature of from 500° C. to 550° C. for 2 hours to 20 hours to crystallize the amorphous semiconductor film, so that the crystalline semiconductor film is formed. In the heat treatment, it is preferable to gradually change the heating temperature. The initial low-temperature heat treatment can extract hydrogen or the like in the amorphous semiconductor film. Accordingly, so-called dehydrogenation which reduces the roughness of the film in the crystallization can be performed. Alternatively, a magnetic field may be applied to crystallize the semiconductor film in combination with its magnetic energy, or a microwave of high output may also be used. In this embodiment mode, the heat treatment is performed at a temperature of 550° C. for 4 hours after beat treatment at a temperature of 500° C. for one hour by using a vertical furnace.

Then, the crystalline semiconductor film is patterned to form an island-shaped semiconductor film 402.

Figure 12B:
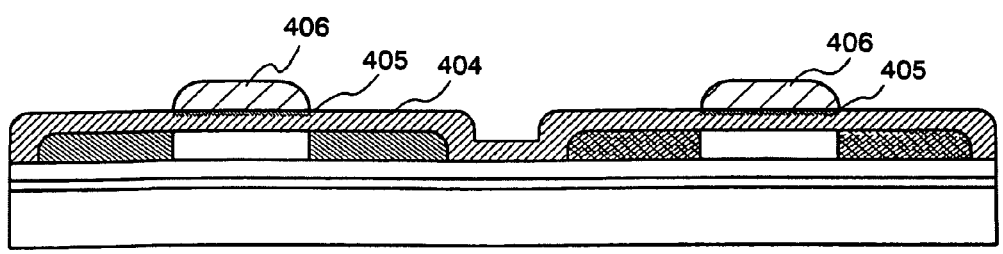

An insulating film which functions as a gate insulating film 404 is formed to cover the island-shaped semiconductor film 402 as shown in FIG. 12B. In this embodiment mode, $TiO_2$ which is a photocatalytic substance is used for the gate insulating film. $TiO_2$ can be manufactured by the method described in the above embodiment mode.

Then, an irradiation region 405 is formed over $TiO_2$ in a region where a conductive film which functions as a gate electrode is to be formed. The irradiation region shows a hydrophilic property. Therefore, a dot including a conductive material mixed into a water-based solvent is used in this embodiment mode in the case of forming the gate electrode by an ink-jet method. The conductive film can be selected from the material described in the above embodiment mode, and Al is used in this embodiment mode. Then, a dot is dropped from above the irradiation region to the irradiation region. Thereafter, a gate electrode 406 is formed by performing heat treatment for baking or the like as described in the above embodiment mode.

Subsequently, an impurity element is added in a self-aligned manner by using the gate electrode 406. For example, phosphorus (P) is added to the semiconductor film to be an N channel thin film transistor and boron (B) is added to the semiconductor film to be a P channel thin film transistor.

Figure 12C:
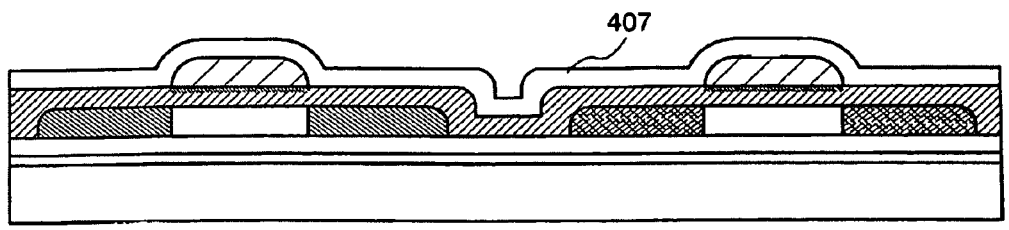

An insulating film 407 containing nitrogen is formed to cover the gate electrode 406 as shown in FIG. 12C. In this embodiment mode, the insulating film 407 can be formed by an ink-jet method. Subsequently, a dangling bond of the semiconductor film can be reduced by thereafter heating with the insulating film 407 provided.

Figure 12D:
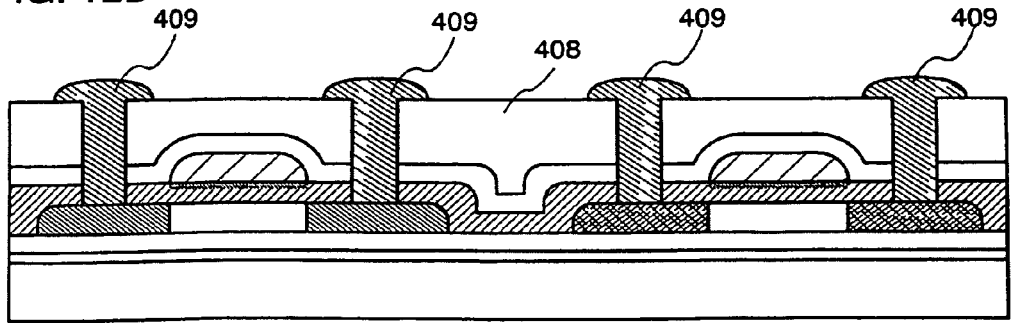

An interlayer insulating film 408 is formed to cover the insulating film 407 as shown in FIG. 12D. An inorganic material (silicon oxide, silicon nitride, silicon oxynitride, or the like), a photosensitive or non-photosensitive organic material (polyimide, acrylic, polyamide, polyimidamide, a resist, or benzocyclobutene), a material in which a skeletal structure is configured by a bond of silicon (Si) and oxygen (O) and which contains at least hydrogen as a substituent, or which contains at least one kind of fluorine, an alkyl group, and aromatic hydrocarbon as a substituent, that is, so-called siloxane, or a laminated structure thereof can be used as the interlayer insulating film. A positive photosensitive organic resin or a negative photosensitive organic resin can be used as the organic material. For example, when positive photosensitive acrylic is used as the organic material, an opening having a curvature in its top edge portion can be formed by etching the photosensitive organic resin with light-exposure treatment.

A contact hole is opened in the interlayer insulating film 408 over an impurity region to form an electrode 409. The electrode 409 can also be formed by an ink-jet method.

A thin film transistor can be formed as described above. A semiconductor device having such a thin film transistor is, for example, an integrated circuit or a semiconductor display device. The thin film transistor formed as described in the above embodiment mode can be used particularly in a pixel portion and in a driver circuit portion of the semiconductor display device such as a liquid crystal display device, a DMD (Digital Micromirror Device), a PDP (Plasma Display Panel), or an FED (Field Emission Display).

Thus, a narrower wiring, that is, a smaller wiring in width than a diameter of a dot can be formed using a dot by an ink-jet method utilizing a photocatalytic reaction for a wiring or an electrode of a thin film transistor having a crystalline semiconductor film. Further, a wiring can be formed along a region in which photocatalytic activity is increased even in the case where a dot is discharged out of alignment to some extent. Thus, a position of a wiring to be formed can be controlled with accuracy.

Embodiment Mode 14

A thin film transistor using a crystalline semiconductor film, manufactured by a different method from the above embodiment mode is described in this embodiment mode.

Figure 13A:
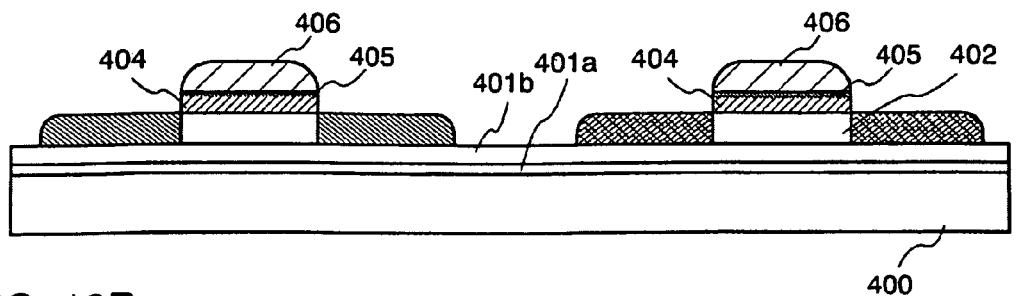
FIGS. 13A to 13D are cross-sectional views showing a step of manufacturing a thin film transistor of the present invention.

Base films 401a and 401b, an island-shaped semiconductor film 402, a gate insulating film 404 containing $TiO_2$, an irradiation region 405, and a gate electrode 406 are formed over a substrate 400 having an insulating surface as described in the above embodiment mode and as shown in FIG. 13A. Then, the gate insulating film 404 containing $TiO_2$ is etched, using the gate electrode 406 as a mask. Wet etching or dry etching may be used as an etching means. Accordingly, $TiO_2$ except a region where the gate electrode is formed can be removed. As for $TiO_2$, $TiO_2$ can be prevented from being photocatalytically activated by a later step or external light by removing $TiO_2$ since it has a photocatalytic function.

Figure 13B:
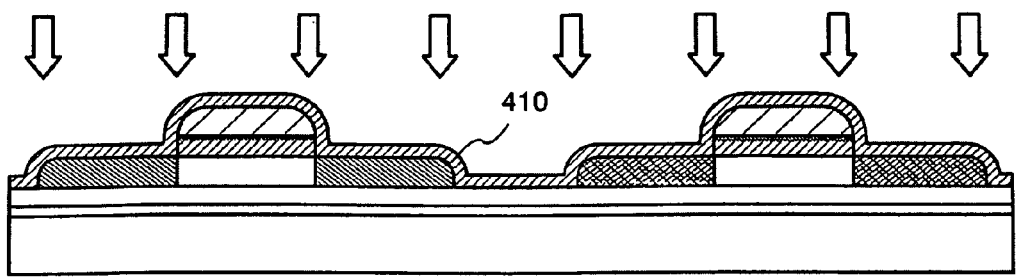

A metal film 410 is formed to cover the island-shaped semiconductor film 402 as shown in FIG. 13B. Then, silicide is formed by reacting the metal film and silicon contained in the island-shaped semiconductor film. The metal film is preferably such a material that silicide to be formed later can have an ohmic contact or close to ohmic contact which is low resistance with the semiconductor. Specifically, molybdenum (Mo), tungsten (W), platinum (Pt), chromium (Cr), titanium (Ti), or cobalt (Co) is preferable. At least one of the above metal materials is reacted with silicon to be silicide. In addition, a laser is emitted from above or a substrate side or heating is performed by an electric furnace to form silicide.

Figure 13C:
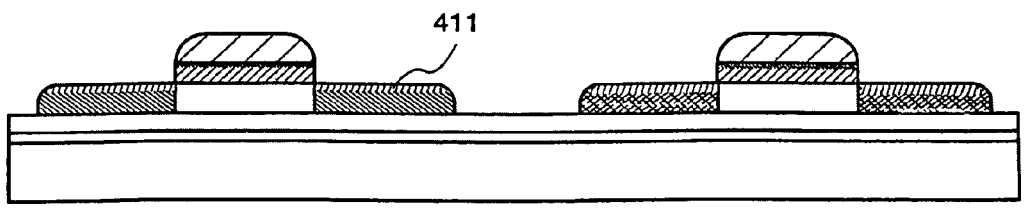

Thereafter, the metal film 410 is removed, and silicide 411 can be formed in a source region and a drain region as shown in FIG. 13C. At this time, it is necessary to control a film thickness of the gate insulating film and a film thickness of suicide to prevent silicide in the source region and the drain region and the gate electrode from short-circuiting.

Figure 13D:
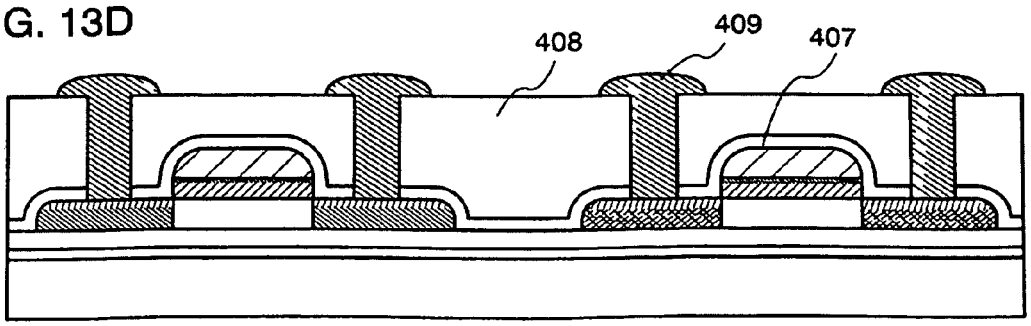

Subsequently, an insulating film 407 and an interlayer insulating film 408 are formed as described in the above embodiment mode and as shown in FIG. 13D. Etching is performed so that the insulating film 407 and the interlayer insulating film 408, and the island-shaped semiconductor film 402 can have a selection ratio, and an electrode (also referred to as a source wiring or a drain wiring) 409 connected to the silicide 411 is formed. The electrode 409 can be formed by an ink-jet method.

With the use of such silicide, a contamination element can be prevented from adhering to the island-shaped semiconductor film in a region where the gate insulating film is removed in a manufacturing step. Further, resistance of the source region and the drain region can be reduced by the silicide.

In addition, a photocatalytic substance can be prevented from being photocatalytically activated in an unnecessary region by removing the photocatalytic substance as described in this embodiment mode.

Embodiment Mode 15

An example of using a thin film transistor using a crystalline semiconductor film in a light emitting device is described in this embodiment mode.

A thin film transistor using a crystalline semiconductor film as in the above embodiment mode can be used in a light emitting device as described in the above embodiment mode. A light emitting direction from an electroluminescent layer can be determined by controlling a light transmitting property of a first electrode and a second electrode as described in the above embodiment mode.

In addition, one pixel is preferably provided with a plurality of thin film transistors in the case of using the crystalline semiconductor film. Each thin film transistor functions as a switching transistor connected to a signal line to which a video signal is inputted, a driving transistor connected to a light emitting element, and a current controlling transistor connected to the driving transistor. A characteristic of each thin film transistor can be either enhancement mode or depletion mode.

Preferably, the switching transistor is an N channel transistor, and the driving transistor and the current controlling transistor are P channel transistors. Since the driving transistor is a P channel transistor, the light emitting element may be formed by sequentially laminating an HIL (hole injection layer), an HTL (hole transport layer), an EML (emission layer), an ETL (electron transport layer), and an EIL (electron injection layer) in this order from the first electrode side. At this time, the first electrode functions as an anode, and the second electrode functions as a cathode.

In a light emitting device equipped with a thin film transistor having a crystalline semiconductor film, an EIL (electron injection layer), an ETL (electron transport layer), an EML (emission layer), an HTL (hole transport layer), and an HIL (hole injection layer) may be sequentially laminated in this order from the first electrode side, and the first electrode may function as a cathode, and the second electrode may function as an anode.

Since other structures such as a specific material of an electroluminescent layer are described in the above embodiment mode, description is omitted.

Note that digital gradation display and analog gradation display can be performed in a light emitting device; however, digital gradation display is preferably performed in a light emitting device using a crystalline semiconductor film.

Embodiment Mode 16

An example of forming a liquid crystal display device having a thin film transistor described in the above embodiment mode is described in this embodiment mode.

Figure 14A:
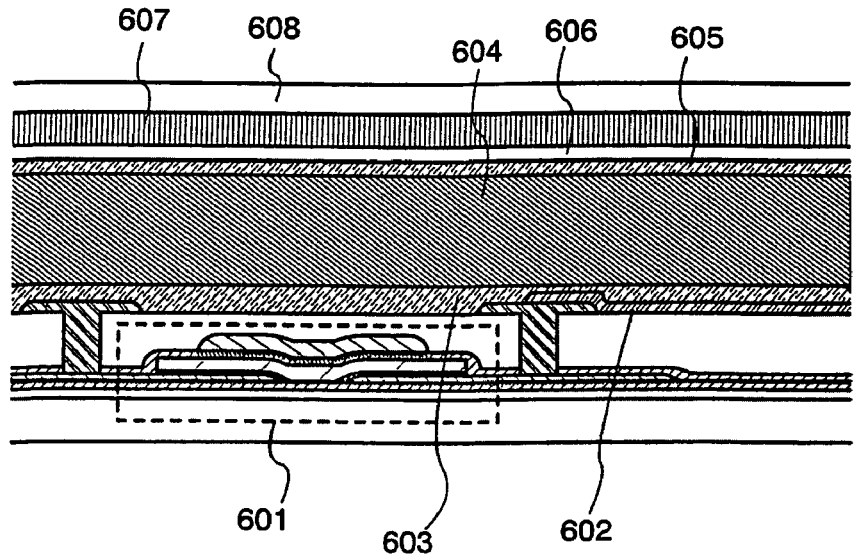
FIGS. 14A to 14C are cross-sectional views showing a step of manufacturing a thin film transistor of the present invention.

FIG. 14A shows a liquid crystal display device using a top gate thin film transistor having an amorphous semiconductor film described in the above embodiment mode as a switching transistor 601.

A pixel electrode 602 which is electrically connected to the thin film transistor is formed. When a light transmitting conductive film (for example, ITO or ITSO) is used as the pixel electrode 602, a transmissive liquid crystal display device can be formed. When a non-light-transmitting, that is, highly reflective conductive film (for example, Al) is used, a reflective liquid crystal display device can be formed. Subsequently, an orientation film 603 is formed to cover the pixel electrode 602.

In addition, an opposing substrate 608 is provided with a color filter 607, an opposite electrode 606, and an orientation film 605. The color filter, the opposite electrode, or the orientation film can be formed by an ink-jet method. Further, a black matrix can be formed by an ink-jet method, although not shown. Thereafter, the opposing substrate 608 is attached using a sealant, and a cell having a liquid crystal element is completed by injecting liquid crystal 604 therebetween. Note that liquid crystal may be dropped to form it. Liquid crystal may be dropped by an ink-jet method.

Subsequently, an FPC (Flexible Printed Circuit) is attached using an anisotropic conductive film, and may be used as an external terminal.

Figure 14B:
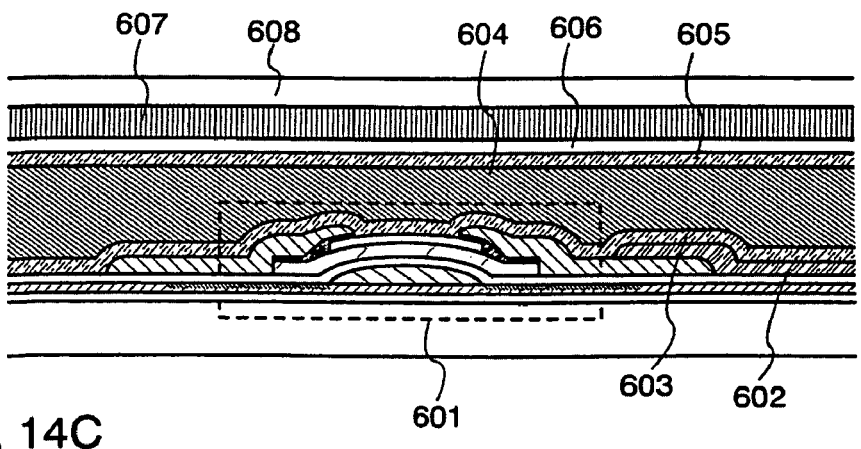
Figure 14C:
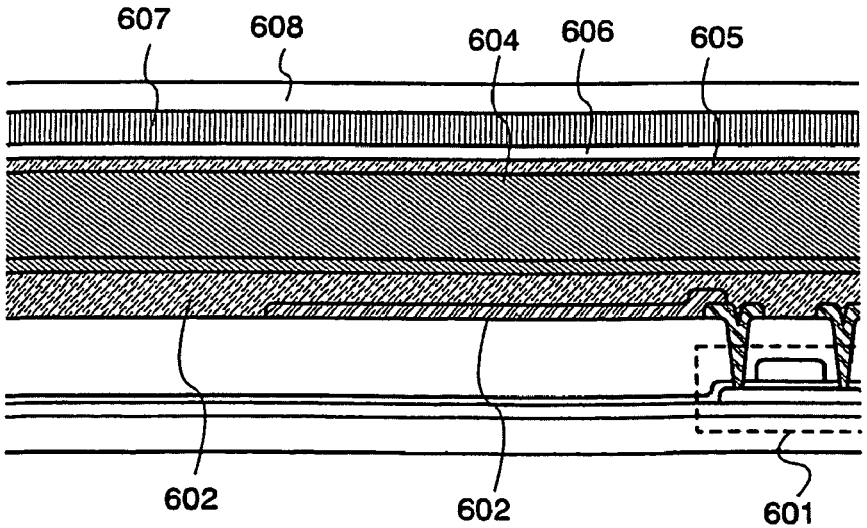

Liquid crystal display devices shown in FIGS. 14B and 14C each show an example of using a thin film transistor having a channel protective amorphous semiconductor film and an example of using a thin film transistor having a crystalline semiconductor as a switching transistor.

Thus, a liquid crystal display device having a narrower wiring, that is, a smaller wiring in width than a diameter of a dot formed by an ink-jet method can be formed. Further, a liquid crystal display device having a wiring formed along a region in which photocatalytic activity is increased can be formed even in the case where a dot is discharged out of alignment to some extent.

Embodiment Mode 17

An ink-jet apparatus (droplet discharge apparatus) for forming the above thin film transistor is described in this embodiment mode.

Figure 15A:
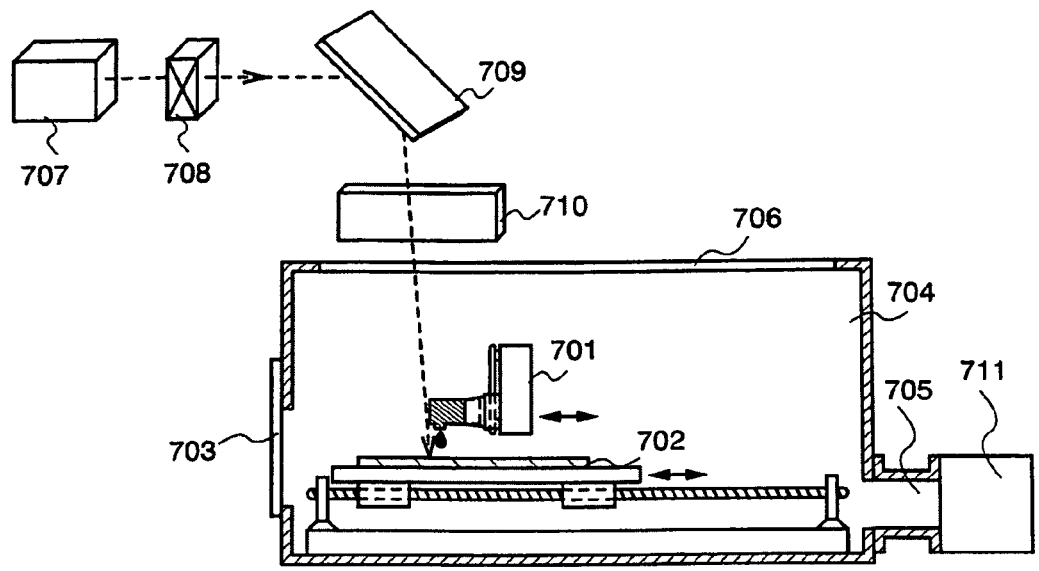
FIGS. 15A and 15B show a droplet discharge apparatus of the present invention.

A droplet discharge apparatus shown in FIG. 15A includes a droplet discharge means 701 and a means (light irradiation means) of irradiating with light having such a wavelength that photocatalytically activates a photocatalytic substance from a window 706. A lamp (for example, an ultraviolet lamp or so-called black light) or a laser light (for example, a XeCl excimer laser having an oscillation wavelength of 308 nm, a XeF excimer laser having an oscillation wavelength of 351 nm, a KrF excimer laser having an oscillation wavelength of 248 nm, or the like) oscillator can be used as the light irradiation means.

Although not shown, the droplet discharge apparatus incorporates a nozzle driving power source and a nozzle heater for discharging a droplet and a moving means of moving the droplet discharge means.

A hydrophilic property or an oil-repellent property can be controlled by light applied from the window (for example, a quartz window) 706. A desired pattern of a wiring or the like can be obtained over a substrate 702 by discharging a dot with the droplet discharge means. Preferably, a desired pattern of a wiring or the like may be formed in a region where a hydrophilic property or an oil-repellent property is controlled. Further, a photocatalytic substance is discharged from the droplet discharge means and can be photocatalytically activated by light applied from the window 706.

In such a droplet discharge apparatus, the substrate 702 is carried into a reaction chamber 704 from a carrying entrance 703. The substrate 702 is placed on the conveyance table having a moving means in an X-Y axis direction and can be moved to an optional point on an X-Y plane. Droplet discharge treatment begins when the substrate 702 reaches a predetermined position where the droplet discharge means 701 is waiting by move of the conveyance table. The droplet discharge treatment is accomplished by relative move of the droplet discharge means 701 and the substrate 702 and predetermined timing of droplet discharge, and a desired pattern can be drawn over the substrate 702 by adjusting each movement speed and cycles of discharging a droplet from the droplet discharge means 701. Since droplet discharge treatment specifically requires high accuracy, it is preferable to stop movement of the substrate on the conveyance table and to make only the highly controllable droplet discharge means 701 scan. In addition, it is conceivable that the droplet discharge means and the substrate on the conveyance table are simultaneously moved to prevent a clot of a dot from being formed at a starting point and at an end point.

The reaction chamber 704 is provided with the window 706, and light from the light irradiation means 707 provided outside a chassis enters through the quartz window 706. An optical system 710 made up of a shutter 708, a reflecting mirror 709, a cylindrical lens or a convex lens, or the like is provided in the light path. In the droplet discharge apparatus of this embodiment mode, light can be made incident on the substrate 702 obliquely from above by adjusting the optical system. A distance between a tip of a droplet discharge portion of the droplet discharge means 701 and the substrate 702 is approximately several mm. Therefore, incident light is preferably at an angle of equal to or more than 45° toward a normal line direction of the substrate 702. In the case of using a light transmitting material as the substrate 702, light can be applied from a bottom face of the substrate 702. In this case, a window is provided on the bottom face of the reaction chamber.

Further, it is preferable to provide an exhaust port 505 of the reaction chamber 704 with a pressure reducing device 711 and to vacuum evacuate the chamber to hasten drying of a landed droplet and to remove a solvent component of the droplet. However, it can be performed under atmospheric pressure. In the case of performing under atmospheric pressure or the like, the reaction chamber or the quartz window is not necessarily required. Although not shown, a sensor or a CCD camera for alignment to the pattern on the substrate, a means of heating the substrate and a means for measuring various physical properties such as temperature and pressure may be provided, if necessary. In addition, these means can be collectively controlled by a controlling means provided outside the reaction chamber 704. When the controlling means is further connected to a production management system or the like with a LAN cable, a wireless LAN, an optical fiber, or the like, steps can be collectively controlled from outside, thereby improving the productivity.

Although not shown, a beam shape and a beam course can be adjusted by providing an optical system such as a microlens array between a laser oscillator corresponding to the light irradiation means 707 and the substrate 702.

According to the above structures, a droplet discharged from the droplet discharge means 701 is irradiated with a semiconductor laser beam at predetermined timing.

Figure 15B:
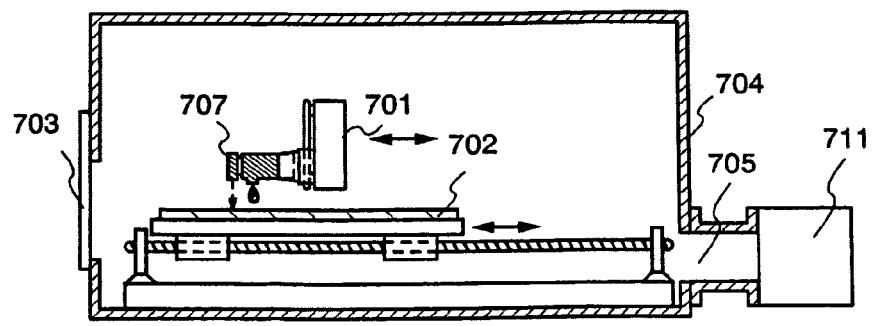

FIG. 15B shows a droplet discharge apparatus in which the light irradiation means 707 is mounted on the droplet discharge means 701, that is, they are integrally formed. Light irradiation position controllability or droplet discharge controllability can be improved by integrally forming. Therefore, a photocatalytic substance is preferably dropped from the droplet discharge means and is preferably irradiated with light having a photocatalytically activating wavelength from the integrally formed light irradiation means. Since other structures are similar to that in FIG. 15A, description is omitted.

In this embodiment mode, droplet discharge is performed by a so-called piezo method using a piezoelectric element; however, a so-called thermal ink-jet method which makes a heating element generate heat to generate bubbles, thereby pushing out a solution may be employed depending on a solution material. In this case, the piezoelectric element is replaced with a heating element. In addition, wettability of a solution with a liquid chamber channel, a spare liquid chamber, a fluid resistance portion, a compression chamber, and a solution outlet (a nozzle or a head) is important for droplet discharge. Therefore, a carbon film, a resin film, or the like for adjusting wettability with a material may be formed in each flow path.

According to the above structure of the apparatus, a pattern can be formed with high accuracy over a substrate to be treated by using a droplet discharge means, and further, a photocatalytic substance can be efficiently irradiated with light having a photocatalytically activating wavelength. In addition, a droplet discharge method includes a so-called sequential method for forming a continuous linear pattern by continuously discharging a solution and a so-called on-demand method for discharging a solution to be dot-shaped, and either of them can be employed.

Embodiment Mode 18

A mode of a module such as a light emitting device or a liquid crystal display device described in the above embodiment mode is described in this embodiment mode.

Figure 18:
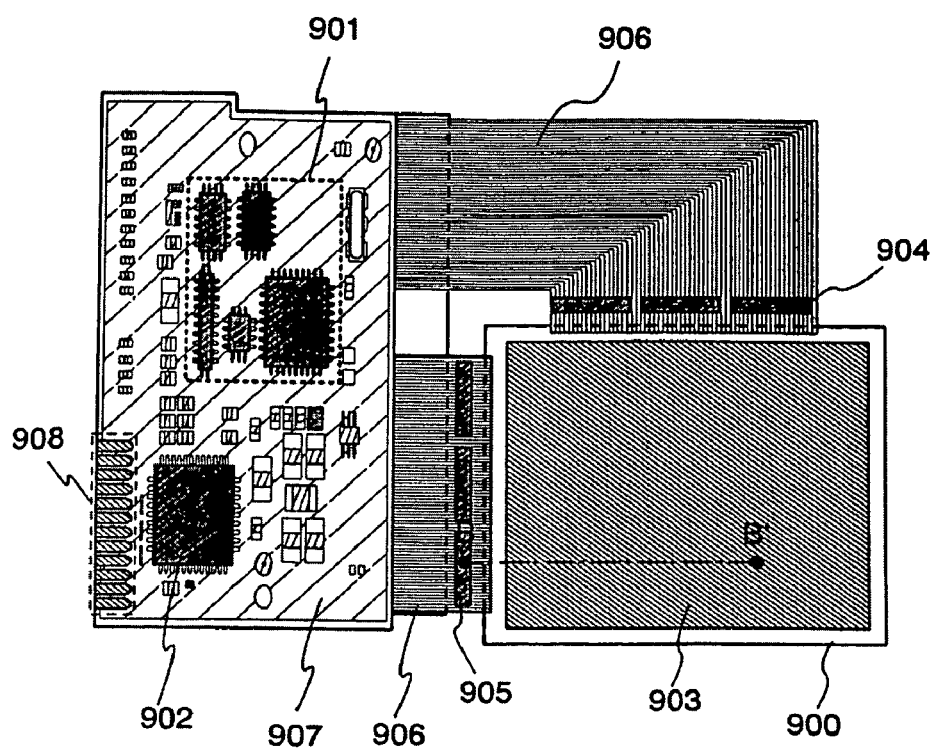
FIG. 18 is a top view of a module of the present invention.

FIG. 18 shows an appearance of a module on which a control circuit 901 and a power supply circuit 902 are mounted. A pixel portion 903 in which a light emitting element or a liquid crystal element is provided for each pixel is provided over a substrate 900. A thin film transistor included in the pixel portion 903 can be formed by an ink-jet method utilizing a photocatalytic reaction as described in the above embodiment mode. A scanning line driver circuit 904 for selecting a pixel included in the pixel portion 903 and a signal line driver circuit 905 for supplying the selected pixel with a video signal are mounted with an IC chip. Further, the length of a long side and a short side of an IC to be mounted and the number thereof are not limited to those in this embodiment mode.

A printed wiring board 907 is provided with the control circuit 901 and the power supply circuit 902. Various kinds of signals and power supply voltage outputted from the control circuit 901 or the power supply circuit 902 are supplied through an FPC 906 to the scanning line driver circuit 904 and the signal line driver circuit 905, and further to the pixel portion 903.

The power supply voltage and various kinds of signals of the printed wiring board 907 are supplied through an interface (I/F) portion 908 in which a plurality of input terminals is disposed.

Note that the printed wiring board 907 is mounted with using the FPC 906 in this embodiment mode; however, the present invention is not necessarily limited to this structure. The control circuit 901 and the power supply circuit 902 may be mounted directly on the substrate by a COG (Chip On Glass) method. In addition, a mounting method of an IC chip such as the signal line driver circuit and the scanning line driver circuit is not limited to this embodiment mode, and an IC chip formed over the substrate may be connected to a wiring in a pixel portion by a wire bonding method.

Further, in the printed wiring board 907, noise may be caused in the power supply voltage or signals, or the rise of the signal may become slow due to capacitance formed between lead wirings, resistance of the wiring itself and the like. Thus, various kinds of elements such as a capacitor and a buffer may be provided on the printed wiring board 907, thereby preventing noise from being caused in the power supply voltage or signals, or preventing the rise of the signal from becoming slow.

As described above, a module having a thin film transistor formed by an ink-jet method utilizing a photocatalytic reaction can be formed.

Embodiment Mode 19

A sealed state of a light emitting device or a liquid crystal display device described in the above embodiment mode is described in this embodiment mode.

Figure 19A:
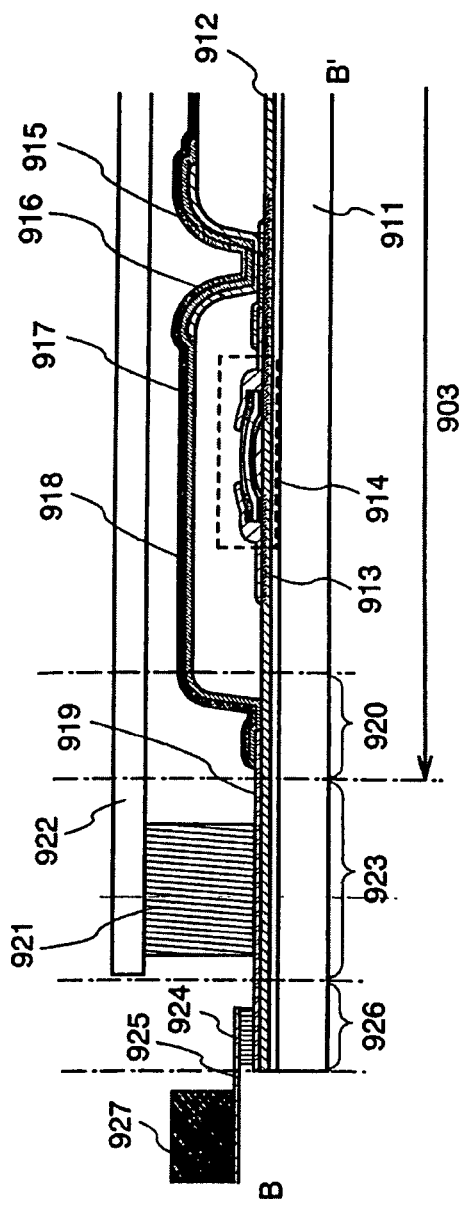
FIGS. 19A and 19B are cross-sectional views of a display device of the present invention.

FIG. 19A shows a light emitting device and corresponds to a cross-sectional view taken along a line B-B' in FIG. 18. In a pixel portion 903, an N channel driving TFT 914 is provided over a substrate (referred to as a first substrate for convenience) 911 with a base film and a photocatalytic substance 912 therebetween. The photocatalytic substance has an irradiation region 913, and a driving TFT is formed by an ink-jet method utilizing a photocatalytic reaction as described in the above embodiment mode. An anode 915 is connected to a wiring which functions as a source electrode or a drain electrode included in the driving TFT. An electroluminescent layer 916 and a cathode 917 are sequentially formed over the anode.

Further, a protective film 918 is provided to cover the cathode. The protective film is formed to have an insulating film which mainly contains silicon nitride or silicon nitride oxide obtained by a sputtering method (a DC method or an RF method) or a DLC film (Diamond Like Carbon) which contains hydrogen. In addition, the protective film can have a single layer structure or a laminated structure of the above described film. The protective film can prevent the electroluminescent layer from being deteriorated by moisture, oxygen, or the like.

The cathode and the protective film are provided to a first connection region 920. The cathode is connected to a connection wiring 919 in the connection region 920.

In a sealing region 923, the first substrate 911 and an opposing substrate (referred to as a second substrate for convenience) 922 are attached to each other with a sealant 921 therebetween. The sealant is made of a thermosetting resin or an ultraviolet curing resin, and attaches and fixes the first substrate and the second substrate to each other by being heated with pressure applied or being irradiated with an ultraviolet ray. For example, an epoxy-based resin can be used as the sealant. The sealant is mixed with a spacer, and holds an interval, that is, a so-called gap between the first substrate and the second substrate. As the spacer, the one having a spherical shape or a columnar shape is used. In this embodiment mode, a cylindrical spacer is laid down and used, and a diameter of a circle is a gap.

In a second connection region 926, the connection wiring 919 is connected to a signal line driver circuit formed with an IC chip 927 with an anisotropic conductive film 924 therebetween. Note that the IC chip is provided over an FPC 925. When the anisotropic conductive film is attached by pressurizing or heating, an attention should be paid so that crack is not generated due to flexibility of a film substrate or softening by heating it. For example, the substrate having high hardness may be disposed as a support in the region to be attached. In this way, a video signal or a clock signal is received from the connected IC chip.

When the first substrate is sealed with the second substrate 922, a space is formed between the second substrate and the protective film 918. The space is filled with an inert gas, for example, a nitrogen gas or provided with a material having a high moisture-absorbing property in order to prevent moisture or oxygen from penetrating thereinto. Alternatively, a light-transmitting resin having a high moisture-absorbing property may be formed. Since the resin is light-transmitting, transmittance does not decrease even when light from the light-emitting element is emitted to a second substrate side.

Figure 19B:
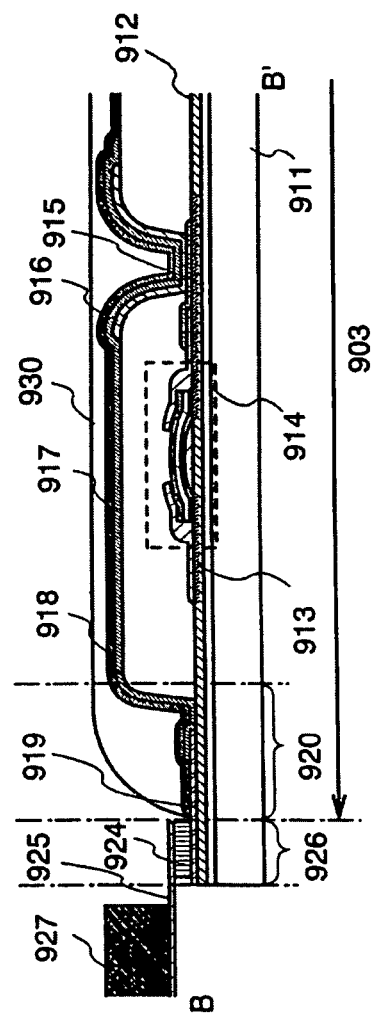

FIG. 19B shows the case of sealing without using the second substrate, differently from FIG. 19A. Since other structures are similar, description is omitted.

In FIG. 19B, a second protective film 930 is provided to cover the protective film 918. As the second protective film, an organic material such as an epoxy resin, a urethane resin, or a silicone resin can be used. In this embodiment mode, an epoxy resin is dropped by using a dispenser and is dried.

When deterioration of the electroluminescent layer due to moisture, oxygen, or the like does not cause a problem, the protective film 918 may not be provided. Further, a second substrate may be provided over the second protective film for sealing.

As described above, the display device can be more lightweight, miniaturized, and thinned by sealing without using the second substrate.

Embodiment Mode 20

Examples of electronic devices using a display device described in the above embodiment mode can be given as follows: a video camera; a digital camera; a goggle type display (head mounted display); a navigation system; an audio reproducing device (car audio, an audio component, or the like); a laptop personal computer; a game machine; a personal digital assistance (a mobile computer, a cellular phone, a portable game machine, an electronic book, or the like); an image reproducing device including a recording medium (specifically, a device capable of reproducing a recording medium such as a Digital Versatile Disc (DVD) and having a display that can display the image of the data); and the like. Specifically, an ink-jet method described in the above embodiment mode is preferably employed for a large television having a large screen, or the like. Practical examples of these electronic devices are shown in FIGS. 16A to 16C.

Figure 16A:
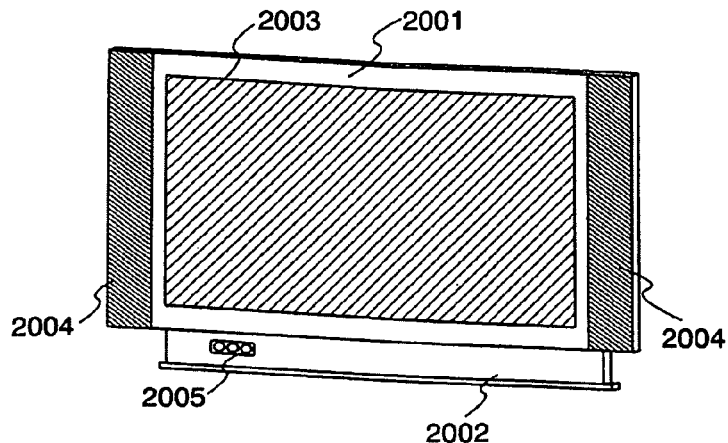
FIGS. 16A to 16C show an electronic device of the present invention.

FIG. 16A shows a large display device, which includes a chassis 2001, a supporting section 2002, a display portion 2003, speaker portions 2004, a video input terminal 2005, and the like. The display portion 2003 is provided with a module including a pixel portion and a driver circuit portion. The pixel portion has a light emitting element or a liquid crystal element and a TFT formed by an ink-jet method described in the above embodiment mode. Note that the display device includes all display devices for displaying information, including ones for personal computers, for TV broadcasting reception, and for advertisement.

Figure 16B:
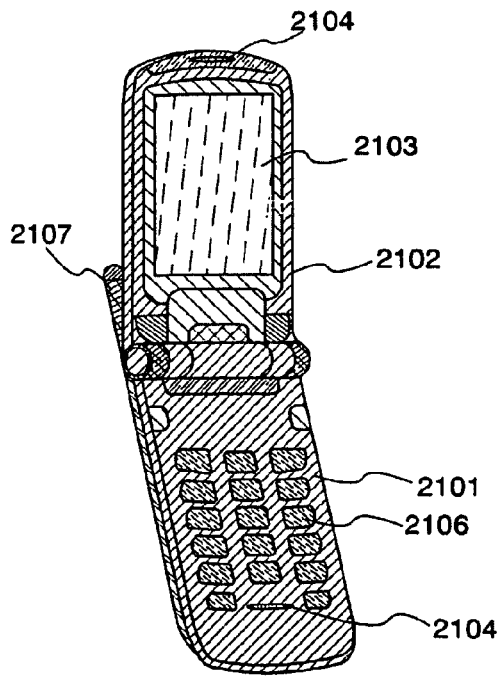

FIG. 16B shows a cellular phone that is one of mobile terminals, which includes a main body 2101, a chassis 2102, a display portion 2103, an audio input portion 2104, an audio output portion 2105, operation keys 2106, an antenna 2107, and the like. The display portion 2103 is provided with a module including a pixel portion and a driver circuit portion. The pixel portion has a light emitting element or a liquid crystal element and a TFT formed by an ink-jet method described in the above embodiment mode. In addition, costs of the cellular phone can be reduced by forming the display portion 2103 with gang printing.

Figure 16C:
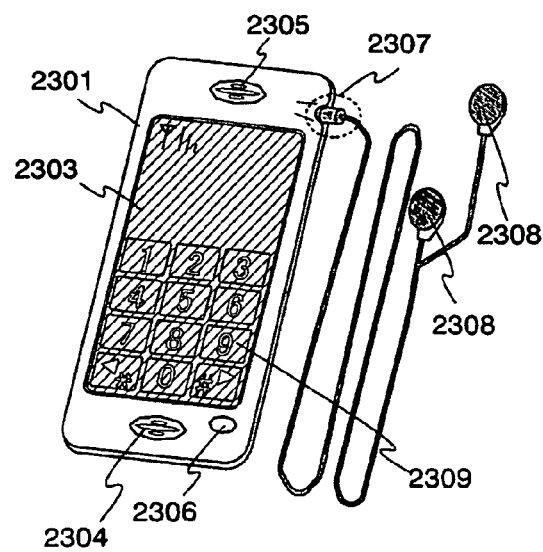

FIG. 16C shows a sheet-shaped cellular phone, which includes a main body 2301, a display portion 2303, an audio input portion 2304, an audio output portion 2305, a switch 2306, an external connection port 2307, and the like. A separately prepared earphone 2308 can be connected to the cellular phone through the external connection port 2307. A touch panel display screen having a sensor is used for the display portion 2303. A continuous stream of operation can be performed by touching a touch panel operation key 2309 displayed on the display portion 2303. The display portion 2303 is provided with a module having a pixel portion and a driver circuit portion. The pixel portion has a light emitting element or a liquid crystal element and a TFT formed by an ink-jet method described in the above embodiment mode. In addition, costs of the sheet-shaped cellular phone can be reduced by forming the display portion 2303 with gang printing.

As described above, an applicable range of the present invention is so wide that the present invention can be applied to electronic devices of various fields. In addition, the electronic device of this embodiment mode can employ any structure described in the above embodiment mode.

This application is based on Japanese Patent Application serial no. 2003-344202 filed in Japan Patent Office on Oct. 2, 2003, the contents of which are hereby incorporated by reference.

Although the present invention has been fully described by way of example with reference to the accompanied drawings, it is to be understood that various changes and modification will be apparent to those skilled in the art. Therefore, unless otherwise such changes and modification depart from the scope of the present invention hereinafter defined, they should be construed as being included therein.

What is claimed is:

1. A method for manufacturing a thin film transistor comprising:
    forming a substance having a photocatalytic function over an insulating surface;
    selectively irradiating the substance with light to be oil-repellent;
    discharging a conductive material mixed into an oil-based solvent to an irradiation region of the light by an ink-jet method to form a wiring;
    forming a semiconductor film over the wiring;
    forming a gate insulating film comprising a substance having the photocatalytic function to cover the semiconductor film;
    selectively irradiating the gate insulating film with the light to be oil-repellent; and discharging a conductive film mixed into an oil-based solvent to a region not irradiated with the light by an ink-jet method to form a gate electrode.

2. The method for manufacturing a thin film transistor according claim 1, further comprising the steps of:
   forming an electrode connected to the wiring; and
   forming a protective film by an ink-jet method to cover the semiconductor film, the gate electrode, and a part of the electrode.

3. The method for manufacturing a thin film transistor according to claim 1, further comprising the steps of forming an electroluminescent layer and an electrode over the electroluminescent layer.

4. The method for manufacturing a thin film transistor according to claim 1, further comprising the steps forming an orientation film, dropping a liquid crystal over the orientation film, and attaching an opposing substrate provided with an electrode, a color filter, and the orientation film.

5. The method for manufacturing a thin film transistor according to claim 1, wherein the thin film transistor is incorporated in at least one selected from the group consisting of a video camera, a digital camera, a goggle type display, a navigation system, an audio reproducing device, a personal computer, a game machine, a personal digital assistance, and an image reproducing device.

* * * * *